United States Patent
Guthrie et al.

(10) Patent No.: US 9,667,260 B2
(45) Date of Patent: *May 30, 2017

(54) CURRENT SYNTHESIZER CORRECTION

(71) Applicant: Intersil Americas LLC, Milpitas, CA (US)

(72) Inventors: Travis J. Guthrie, Austin, TX (US); James R. Toker, Cambridge, MA (US); Narendra B. Kayathi, Austin, TX (US); Brannon C. Harris, Austin, TX (US)

(73) Assignee: INTERSIL AMERICAS LLC, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/237,471

(22) Filed: Aug. 15, 2016

(65) Prior Publication Data

US 2016/0359489 A1    Dec. 8, 2016

Related U.S. Application Data

(63) Continuation of application No. 14/598,418, filed on Jan. 16, 2015, now Pat. No. 9,419,627.

(Continued)

(51) Int. Cl.
*G01R 19/00* (2006.01)
*H03L 5/00* (2006.01)
(Continued)

(52) U.S. Cl.
CPC ............ *H03L 5/00* (2013.01); *G01R 19/0092* (2013.01); *G01R 19/25* (2013.01);
(Continued)

(58) Field of Classification Search
CPC .............. G01R 19/00; G01R 19/0046; G01R 19/0092; G01R 19/25; G01R 19/2506; H03L 5/00; H03L 5/02
(Continued)

(56) References Cited

U.S. PATENT DOCUMENTS 6,359,416 B1    3/2002   Rao et al.
7,075,278 B2    7/2006   Uematsu et al.
(Continued)

*Primary Examiner* — William Hernandez
(74) *Attorney, Agent, or Firm* — Foley & Lardner LLP; Mark J. Danielson

(57) ABSTRACT

An adjustable current-synthesizer may generate synthesized current representative of an actual current, according to a model of a circuit that produces the actual current. The current synthesizer may under-sample a current sense signal derived from the actual current to obtain a few samples of the actual current, which are then used to adjust the synthesized current, thereby ensuring accuracy of the synthesized current. Sample values of the actual current are compared with corresponding generated values of the synthesized current to obtain offset values. In order to maintain monotonicity in the synthesizer results, the offset values are used to make adjustments to the slope of the synthesized current. The slope of the synthesized current may also be adjusted according to the slope of the actual current. Sub-Nyquist sampling of the actual current may be performed on the down-slope, with up-slope adjustments made based on the offset adjustment and down-slope adjustment.

17 Claims, 18 Drawing Sheets

Related U.S. Application Data

(60) Provisional application No. 61/990,219, filed on May 8, 2014, provisional application No. 62/001,162, filed on May 21, 2014, provisional application No. 62/057,871, filed on Sep. 30, 2014.

(51) Int. Cl.
  *G01R 19/25* (2006.01)
  *H02M 3/157* (2006.01)
  *H02M 3/158* (2006.01)
  *H02M 1/00* (2006.01)

(52) U.S. Cl.
  CPC ........ *G01R 19/2506* (2013.01); *H02M 3/157* (2013.01); *H02M 3/1584* (2013.01); *H02M 2001/0009* (2013.01)

(58) Field of Classification Search
  USPC ........................................ 327/105, 106, 107
  See application file for complete search history.

(56) References Cited

U.S. PATENT DOCUMENTS

| | | |
|---|---|---|
| 8,773,111 B2 | 7/2014 | Nishikawa |
| 9,285,399 B2 * | 3/2016 | Babazadeh ........... H02M 3/156 |
| 9,419,627 B2 | 8/2016 | Guthrie et al. |
| 2001/0046145 A1 | 11/2001 | Oknaian et al. |
| 2012/0105078 A1 | 5/2012 | Kikuchi et al. |
| 2014/0002044 A1 | 1/2014 | Babazadeh et al. |
| 2015/0069990 A1 | 3/2015 | Feldtkeller |
| 2015/0198934 A1 | 7/2015 | Kaku et al. |

\* cited by examiner

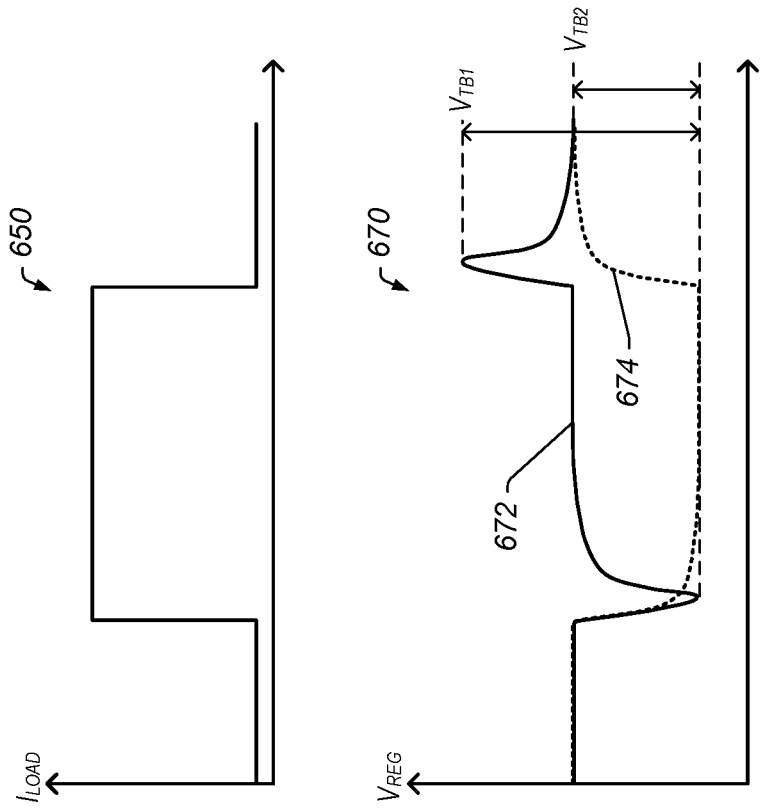
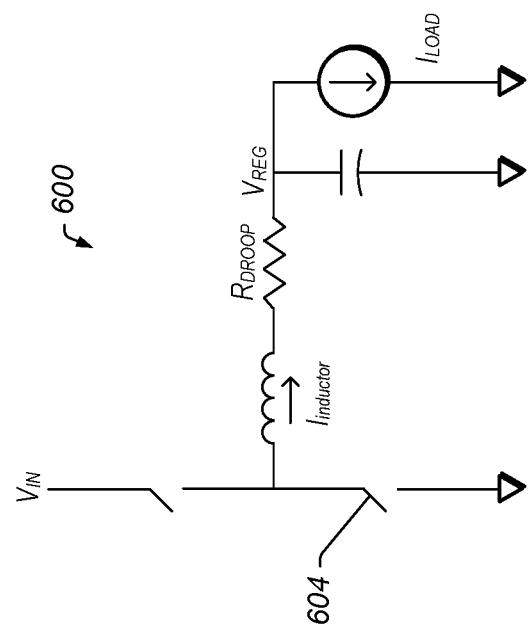
FIG. 6

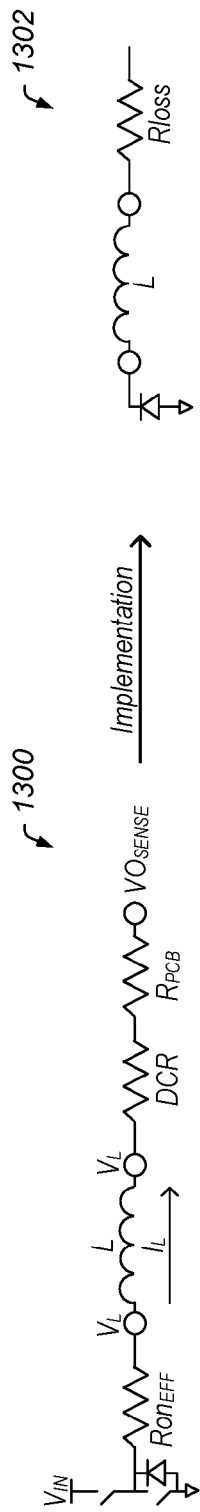
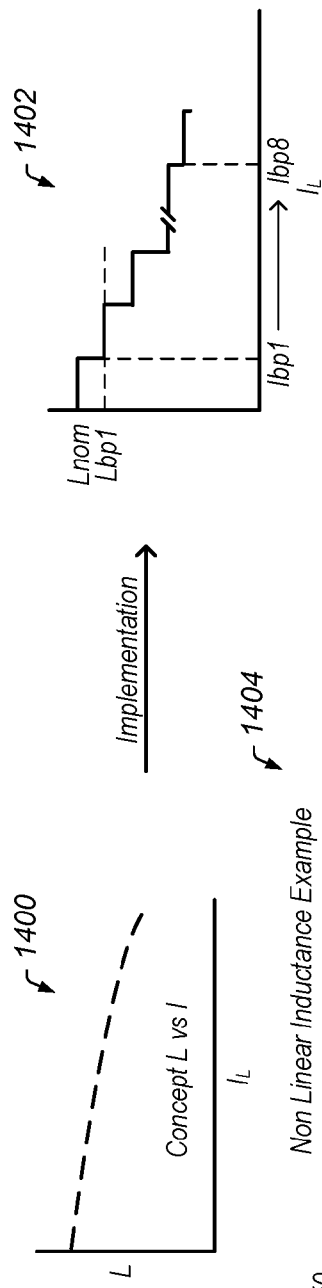
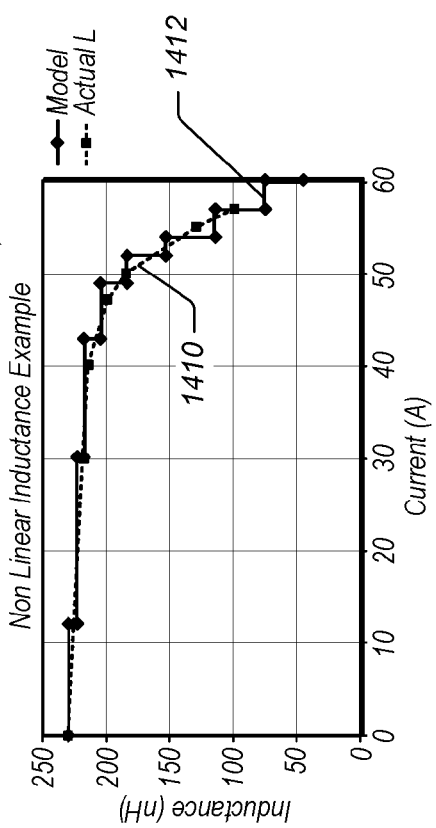
FIG. 13
FIG. 14

CURRENT SYNTHESIZER CORRECTION

CROSS-REFERENCE TO RELATED APPLICATIONS

This application is a continuation of U.S. patent application Ser. No. 14/598,418 filed Jan. 16, 2015, now U.S. Pat. No. 9,419,627. This application also claims benefit of priority of U.S. provisional application Ser. No. 61/990,219 titled "Current Synthesizer Correction", filed May 8, 2014, further claims benefit of priority of U.S. provisional application Ser. No. 62/001,162 titled "Current Synthesizer Correction", filed May 21, 2014, and further claims benefit of priority of U.S. provisional application Ser. No. 62/057,871 titled "Charge Cancellation During Current Measurement", filed Sep. 30, 2014. All such applications are hereby incorporated by reference in their entirety as though fully and completely set forth herein.

BRIEF DESCRIPTION OF THE DRAWINGS

FIG. 6 shows the model of a buck regulator such as the buck regulator shown in FIG. 1, and graphs representing the output voltage and load current response of the model, according to one embodiment;

FIG. 13 shows a conceptual model and a simplified model of a lossy circuit indicating various resistances, according to one embodiment;

FIG. 14 shows diagrams of conceptual inductance versus current, with programmable break-points scaling the inductance to model for non-linearity, according to one embodiment;

Figure 1:
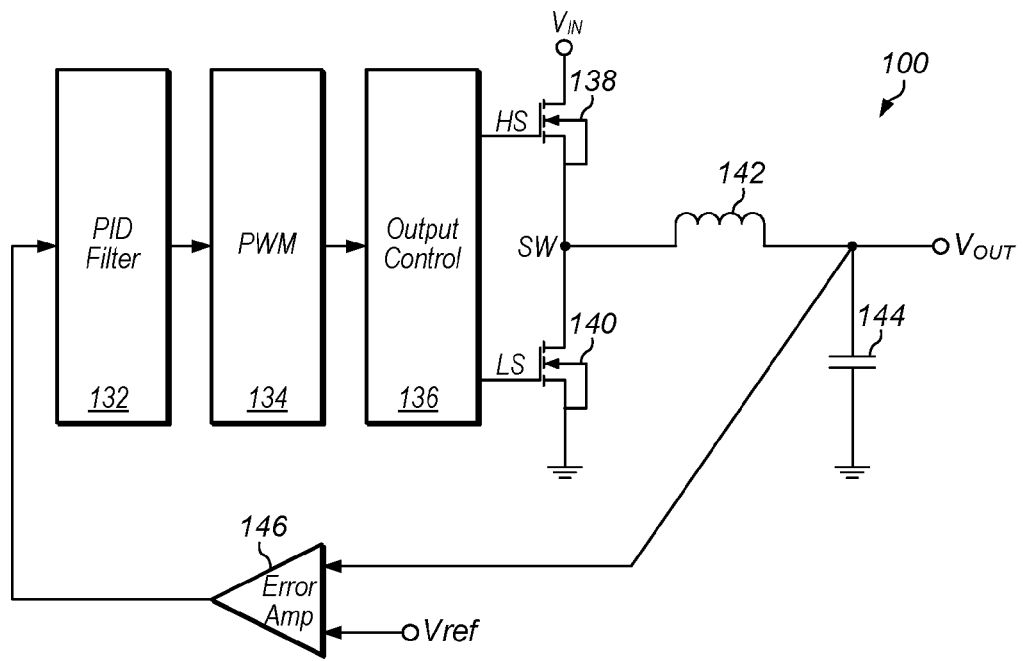
FIG. 1 shows the circuit diagram of one embodiment of a power converter also known as a buck-converter, according to prior art.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include", and derivations thereof, mean "including, but not limited to". The term "coupled" means "directly or indirectly connected".

DETAILED DESCRIPTION

DC-to-DC voltage conversion is often performed by switching voltage regulators, or step-down regulators, also referred to as voltage converters, point-of-load regulators, or power converters, converting a higher voltage (e.g. 12V) to a lower value as required by one or more load devices. More generally, voltage regulators and current regulators are commonly referred to as power converters, and as used herein, the term power converter is meant to encompass all such devices. A common architecture features distribution of the higher voltage to multiple voltage regulators, each producing a different (or possibly the same) voltage to one or more loads. Switching voltage regulators often use two or more power transistors to convert energy at one voltage to another voltage. One common example of such a voltage regulator 100, commonly called a "Buck Regulator" is shown in FIG. 1. Buck Regulator 100 is a switching regulator (or switching power converter) that typically switches a pair of power transistors (138 and 140) in order to produce a square-wave at the transistors' common node SW. The produced square-wave can be smoothed out using an LC circuit comprising inductor 142 and capacitor 144 to produce the desired voltage, $V_{out}$. A feedback control loop, including an Error Amplifier 146, a Proportional-Integral-Differential (PID) control filter 132, a Pulse-Width-Modulator (PWM) 134, and an Output Control circuit 136 (which includes the drive circuitry to drive high-side and low-side FETs 138 and 140, respectively), can be configured to control the duty-cycle of the output square-wave, and hence the resulting value of $V_{out}$.

Figure 2B:
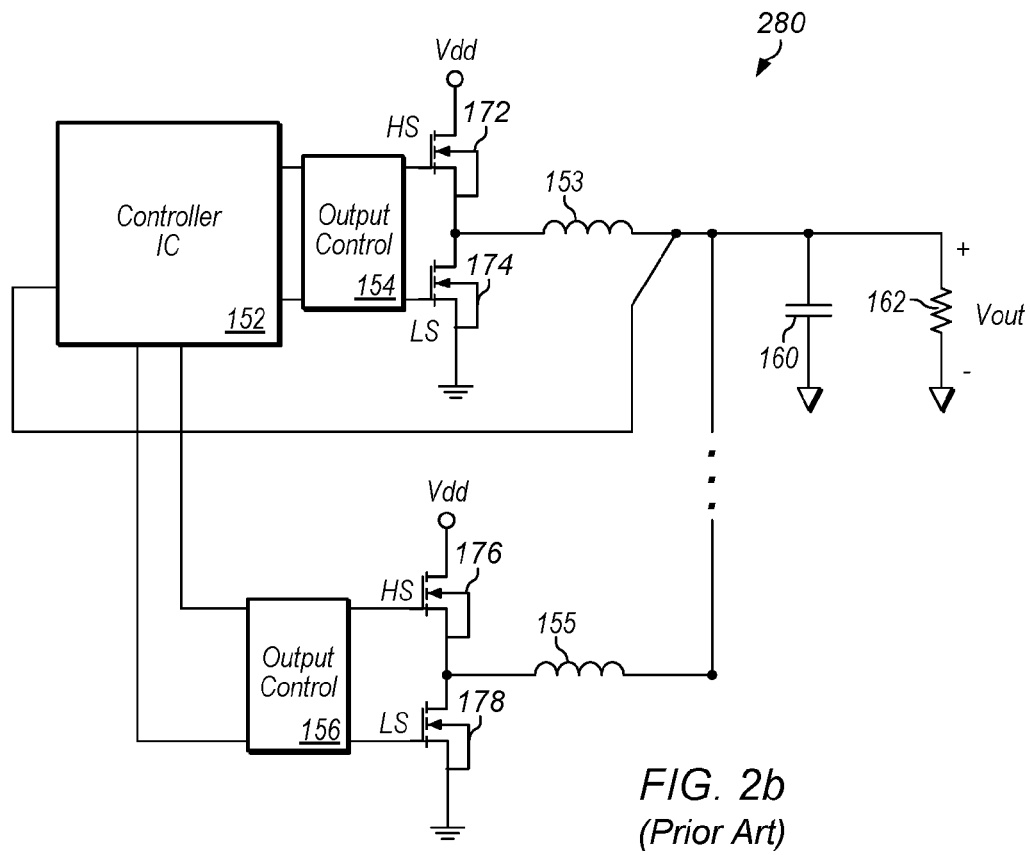
FIG. 2b shows the circuit diagram of a multiphase current share configuration with multiple voltage regulators providing current to a common node under control of a common controller, according to prior art.
Figure 2A:
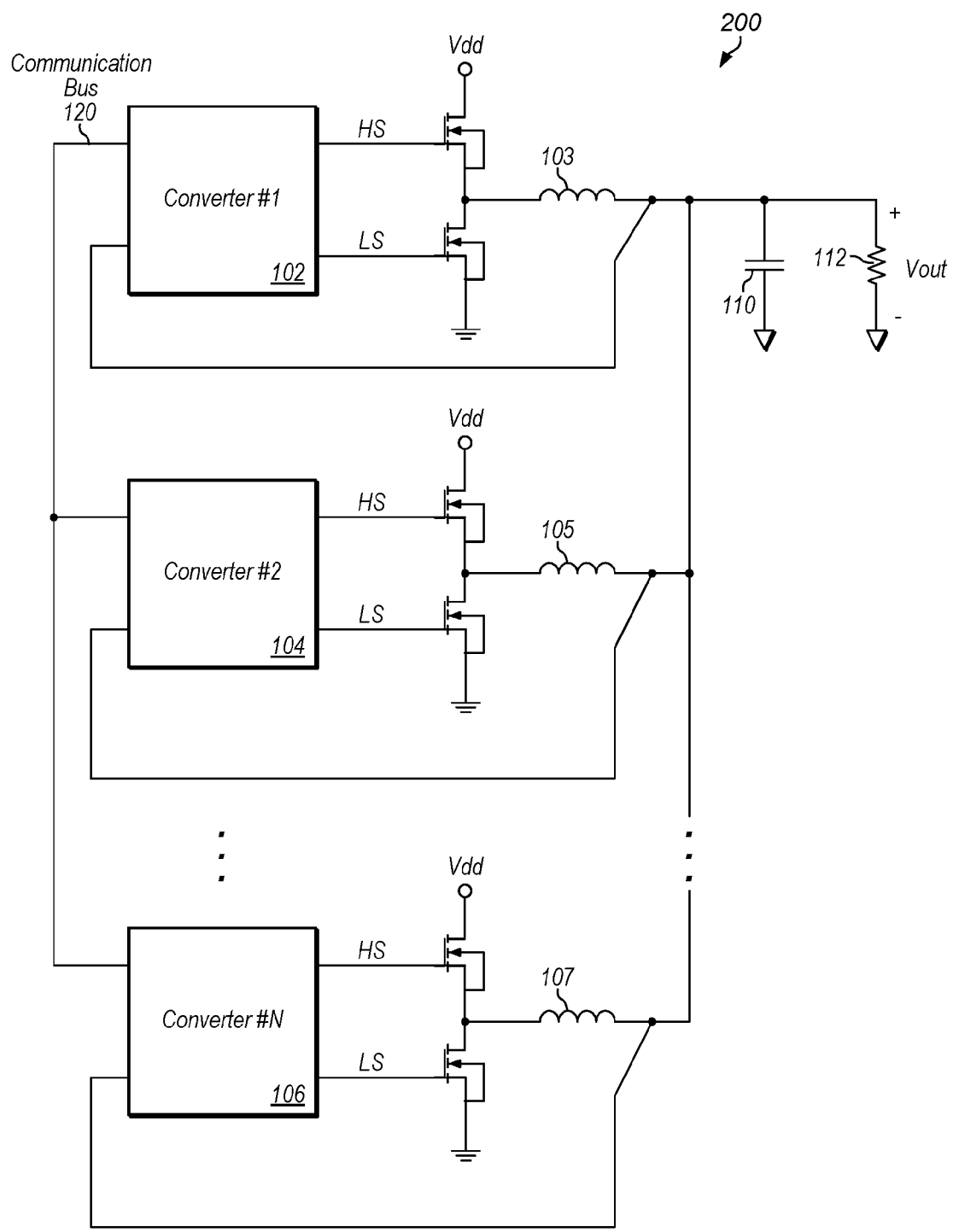
FIG. 2a shows the circuit diagram of a current share configuration with multiple voltage regulators providing current to a common node, according to prior art.

Voltage regulators such as regulator 100 are sometimes included in a current share configuration in which power is distributed through shared voltage supplies. Distributed power through shared point of load supplies has a number of compelling advantages over a single point of load supply, or regulator. Distributed power or current sharing may be used to accommodate the ever increasing current demands associated with low voltage applications through better efficiency over a wide range of output currents, reliability through redundancy, and distributed heat dissipation. One example of a current sharing configuration is shown in FIG. 2a. Converters 102, 104, and 106 (representative of a first, second, and Nth converter) may be coupled to a digital communication bus 120, with their respective regulated current outputs shared through respective inductors 103, 105, and 107, and capacitor 110, to provide a single voltage at a load represented by resistance 112. It should be noted that while in FIG. 2a the output stages (the HS FET and LS FET transistor pairs) are shown outside the respective converters, in FIG. 1 the output stage is indicated as being a part of the converter/regulator, to best highlight certain specified features of the different embodiments. It should also be noted that while the output stage is a functional part of the converter, when the converter is configured on an integrated circuit (IC) for example, the control circuit and the output stage may or may not be configured on the same IC.

Another topology similar to the current sharing configuration shown in FIG. 2a is a multiphase regulator. The topology of a multiphase regulator similar to the system shown in FIG. 2a is illustrated in FIG. 2b. Multiphase regulator 280 is similar to the current share configuration 200 shown in FIG. 2a in that it contains multiple output stages with FET-pairs (172/174 and 176/178) and inductors (153 and 155). However, those output stages are providing a single output voltage (at capacitor 160, to exemplary load 162 for example), and a single controller (for example, a controller IC 152) may be used with a single input for voltage feedback, a single compensator (i.e. PID) and multiple PWM outputs. The multiple PWM outputs may be provided to output control (e.g. drive) circuits 154 and 156. In some embodiments, the output control stage(s) may also be part of a single circuit or IC, or the output stages may also be included in controller IC 152. The inter-phase communication bus in multiphase regulator 280 may be contained within the controller 152, allowing high-bandwidth current sharing in a digital controller. While only two output stages are shown in the embodiment of FIG. 2b, various embodiments may include more output stages arranged in a manner similar to those shown. Those skilled in the art will appreciate that various illustrations of the converters (or voltage regulators) and voltage regulator systems disclosed herein are meant to embody all possible implementations in accordance with the principles set forth herein.

Power Supply (Regulator) Control

In many regulators, information about the current (i.e. the inductor current, e.g. the current in inductor 142 in voltage supply/regulator 100) is integral to servicing many of the functions in a PWM controller (such as PWM controller 134 in FIG. 1). These functions include voltage accuracy, transient response, current balance, circuit fault protection, and telemetry. Obtaining high-quality inductor current information to support these functions can be among the more challenging requirements of a controller IC design. Quality may be quantified in terms of accuracy, precision, bandwidth and latency. High-quality comes from high accuracy, high precision, high bandwidth and/or low latency.

Synthesizing inductor current from known system parameters can mitigate much of the challenge of obtaining current information over current measurement alone. This is due to the fact that the dynamic component of current in an inductor (i.e., how the current changes with respect to time) may be calculated from system parameters that can be far less challenging to obtain with high precision than it would be to obtain the value of the current itself. The first order system parameters include the voltage across the inductor and the inductance value, [di/dt=V/L]. A more accurate calculation may include inductor and/or switch losses. And a still more sophisticated calculation may include non-linearities or parameter drift over time. All of these characteristics may be either estimated or measured with relatively low cost in circuit area and power consumption. More sophisticated calculations improve the quality of synthesized information, but come at the expense of computation circuit area and power consumption. Higher quality synthetic (or calculated) information can lower the cost of the measurement circuitry needed to provide the missing steady-state inductor current component. In a system where the synthesizer is designed in digital logic, and steady-state inductor current is measured using a mostly analog circuit, the overall cost and power optimization is benefitted by scaling applied according to Moore's Law. This approach to obtaining output current information may be very attractive for digital power controllers.

The use of synthetic current as described above is well known. However, using synthetic current for all inductor current related functions (e.g. in a PWM controller) requires accuracy not previously realized in current synthesizers. The methods described herein allow for accurate current synthesis intended to meet the accuracy and precision requirements of at least the aforementioned controller features. In components requiring accurate dynamic current such as peak current limiting or fault detection, accurate synthesis may greatly improve upon present controller performance (e.g. present PWM controller performance).

Figure 3:
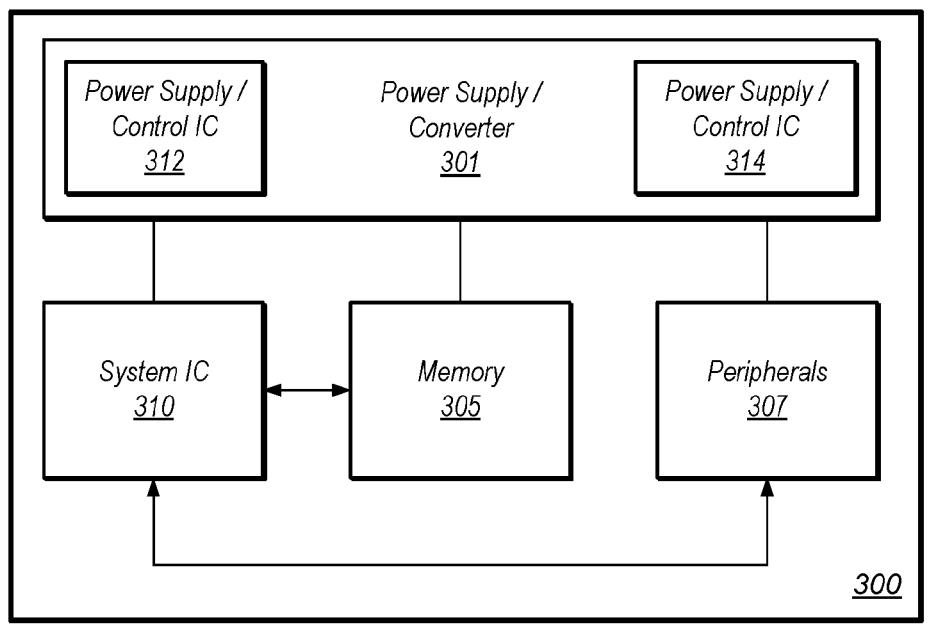
FIG. 3 shows the partial block diagram of a system that includes a power supply/point of load regulator operating according to a novel current synthesizer.

Overall, various embodiments of regulators disclosed herein may include power supply (or power converter or voltage regulator) control circuitry designed to help optimize operation of switching regulators/supplies, including accurate current synthesis that obviates the necessity for performing full-featured current measurements. FIG. 3 shows a block diagram of one embodiment of a system 300 that includes a power supply 301 designed according to the principles described herein, and which will be further detailed below. The system 300 includes at least one instance of a power supply/regulator 301 providing one or more supply voltages to the system integrated circuit (or processing element) 310, one or more peripherals 307 and memory subsystem (or memory) 305. Memory 305 may include, for example, programming instructions that may be executable by processing element 310 to perform various system functions, which may also include controlling and/or operating peripherals 307.

In some embodiments, more than one instance of power supply/converter 301 may be included. Furthermore, regulator 301 may include one or more power supply control integrated circuits, such as power supply control ICs 312 and 314. Power supply control ICs 312 and 314 may include various components such as feedback control circuitry, PWM modulation circuitry, output stage control circuitry and the like. The power supply control ICs may further include a current synthesizer for synthesizing current used in performing control of power supply 301. Furthermore, in some embodiments the control circuitry may not be included on a separate IC or ICs and may simply be a part of power supply 301. Overall, various embodiments of power supply 301 may be divided into two major components, the driving stage that includes high-side and low-side FETS, and the control circuitry encompassing elements performing control of the drive signals driving the FETs in the output stage. As shown in FIG. 3, the control circuitry is embodied in the form of an IC that may couple to either a driving stage (such as output control stage 136 shown in FIG. 1), or it may couple directly to high-side FET(s) and low-side FET(s) such as FETs 138 and 140 in FIG. 1. In some embodiments system 300 may itself be a system on a chip (SOC) whereby system 300 is an IC, with all components, including those of power supply 301 and power supply control ICs 312 and/or 314 a part of the same IC.

The peripherals 307 may include any desired circuitry, depending on the type of system. For example, in one embodiment, the system 300 may be included in a mobile device (e.g., personal digital assistant (PDA), smart phone, etc.) and the peripherals 307 may include devices for various types of wireless communication, such as Wi-Fi, Bluetooth, cellular, global positioning system, etc. The peripherals 307 may also include additional storage, including RAM storage, solid-state storage, or disk storage. The peripherals 307 may include user interface devices such as a display screen, including touch display screens or multi-touch display screens, keyboard or other input devices, microphones, speakers, etc. In other embodiments, the system 300 may be included in any type of computing system (e.g. desktop personal computer, laptop, workstation, net top etc.). Furthermore, the system memory 305 may include any type of memory.

Figure 4:
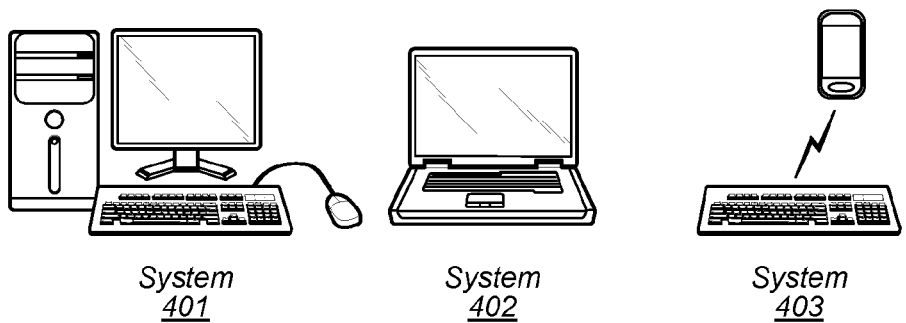
FIG. 4 shows examples of devices that may include embodiments of a novel current synthesizer.

Several embodiments of computing systems that may include all or part of system 300, and more specifically power supply 301 and/or Power supply control ICs 312 and/or 314 are illustrated in FIG. 4. System 401 may represent a desktop computer, system 402 may represent a laptop computer, and system 403 may represent a tablet or smartphone with a wireless keyboard. System 401 may include one or more human interface devices (HIDs), such as a keyboard, a mouse, a microphone, a camera, etc. Systems 402 and system 403 may include similar HIDs to system 401. Other devices not illustrated, such as smart televisions or video game consoles may also include various forms or embodiments of a power supply or power supply controller such as those disclosed herein. It is noted that the computer systems illustrated in FIG. 4 are merely provided as examples. Other types of systems with power supplies/regulators and Power supply control ICs are possible and contemplated.

Droop

Figure 5:
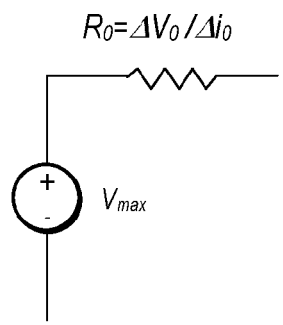
FIG. 5 shows a simple model of a voltage regulator, according to one embodiment.

Droop may be characterized as essentially a change in output voltage resulting from a change in load current. Also widely known as active voltage positioning, or AVP, droop defines the output resistance of the voltage regulator. However, droop is typically implemented by manipulating the regulator's target output voltage in proportion to its output current without using an explicit resistor. This avoids power loss associated with resistance in the output path and can allow greater flexibility is the magnitude of droop employed for a given design. FIG. 5 shows an exemplary embodiment of a simple model of a voltage regulator, modeling the effective output impedance as a ratio of the change in output voltage and the change in output current. FIG. 6 shows an exemplary embodiment of a model 600 of a buck regulator output stage (such as the one shown in FIG. 1), with switches 602 and 604 modeling output power stage transistors 138 and 140, respectively. The inductor current ($I_{inductor}$) follows the load current ($I_{LOAD}$), as illustrated in diagram 650, but cannot change instantaneously. The behavior of the regulated voltage output $V_{REG}$ with respect to time is illustrated in diagram 670. As seen in diagram 670, the inability of the inductor current to change instantaneously causes undershoot and overshoot when the load is applied or connected to the output, and also during load release, i.e. when a load is disconnected or disengaged from the output, as illustrated by voltage waveform 672. Voltage waveform 672 is representative of the output voltage without a droop present. However, with a droop resistance $R_{DROOP}$ present, the target output voltage follows the load, so the output steps down to the undershoot level while the load is applied, but there is no overshoot on load release, as illustrated by waveform 674. This is particularly useful in systems with large step-down ratios, because in such systems the current ramps down slower than it ramps up, making the system more susceptible to overshoot.

As indicated in diagram 670, AVP may effectively reduce the deviation from the expected voltage during current transients. With $R_{DROOP}$ added in the circuit as shown, the required tolerance band ($V_{TB}$) of the voltage regulator is reduced from $V_{TB1}$ without droop to $V_{TB2}$ with droop. A lower tolerance band can have several benefits to the overall system. For example, it may lower the voltage stress on the load, and it may lower the dynamic range requirements of the voltage sense circuit in the PWM controller. AVP also allows for minimizing the capacitance by maximizing the use of the specified voltage tolerances. Droop therefore takes advantage of reduced output voltage requirements with applied loads, and may reduce power/increase efficiency in voltage regulation platforms by reducing the voltage when the current draw is high. Droop implementations may be analog continuous time or sampled time, full digital, or synthetic digital droop.

In systems that support droop, the droop feature may drive the accuracy and latency requirements of inductor current information. Because droop directly impacts the regulated output voltage, accuracy in the droop computation is expected to be in proportion with the accuracy specification for the output voltage of the regulator. Latency in the droop computation may cause the target voltage to adapt slower than the actual current load. This time difference may in turn cause distortion in the settling waveform in which the output voltage adapts in a non-montonic manner, which may be detrimental to some systems (this effect is commonly referred to as "ringback").

Figure 7:
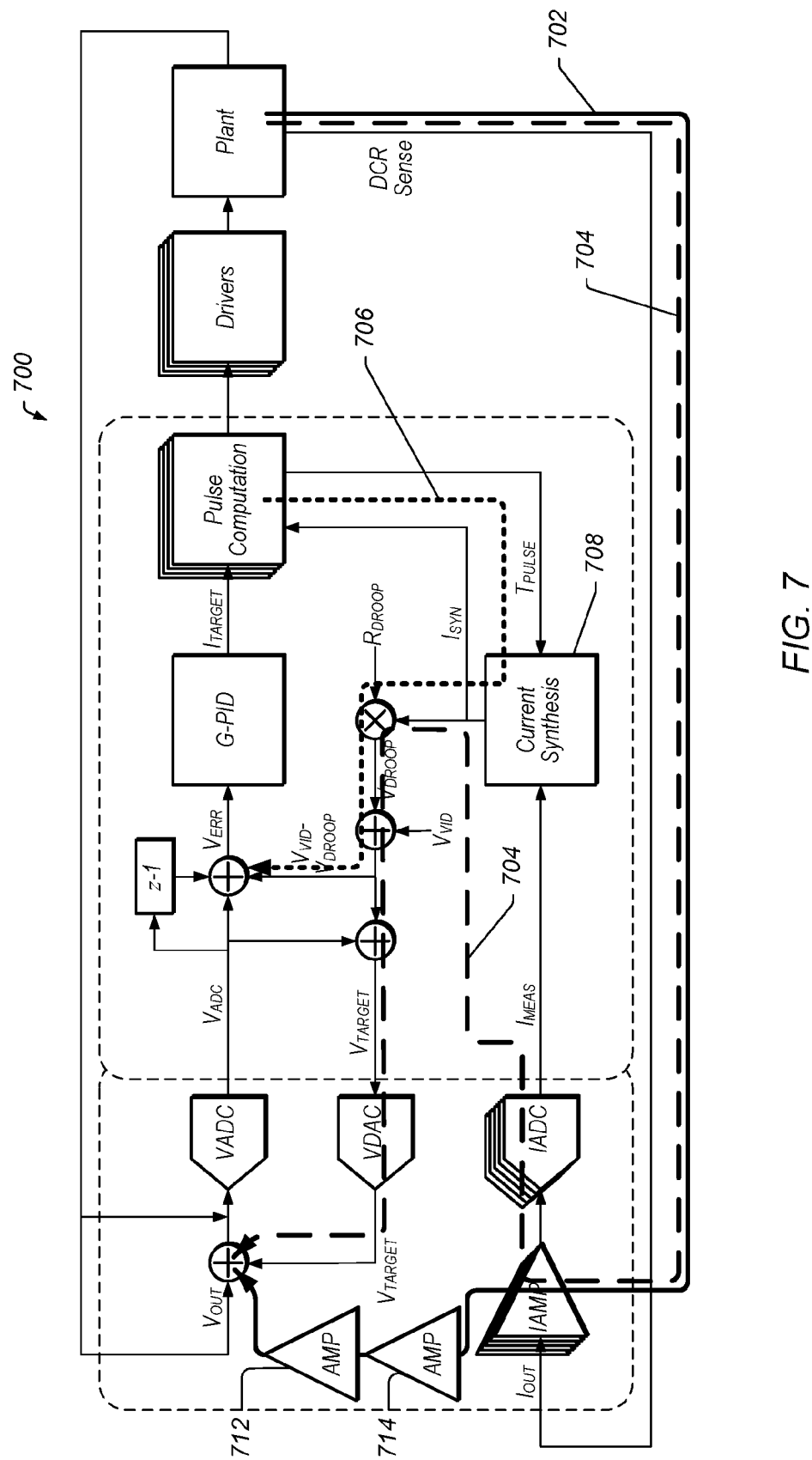
FIG. 7 shows a partial logic diagram of one embodiment of a voltage regulator, illustrating various different alternative droop implementations.

Analog droop implementations include continuous-time or sampled current sense summed with continuous-time or sampled voltage sense. Digital droop includes conversion of both the sampled current and sampled voltage to digital values representative of the current and voltage using high speed ADC (analog to digital converter), then digitally multiplying and summing using the digitized values. Finally, synthetic digital droop generally involves directly converting the output voltage (value) with an ADC, but instead of a direct conversion of the current (value), synthesizing the current waveform using well know parameters of the system. Currents are multiplied and summed digitally, and added to the digitized voltage value. FIG. 7 shows a partial logic diagram of one embodiment of a voltage regulator 700 illustrative of the various different alternative droop implementations. Line 702 (solid) traces the signal path of analog droop, showing extra programmable current sense amplifiers 712 and 714, which result in high power consumption, latency and added noise. Line 704 (dashed) traces the signal path of digital droop, which requires high a sample-rate ADC possibly preceded by a current sense amplifier that also equate to high power consumption, significantly higher latency and added noise. Finally, line 706 (dotted) is representative of synthetic droop, which has the advantage of low power, very low latency and zero noise, but having the disadvantage of not scaling well. As indicated in FIG. 7, a current synthesis circuit 708 is used in implementing synthetic digital droop.

Figure 8:
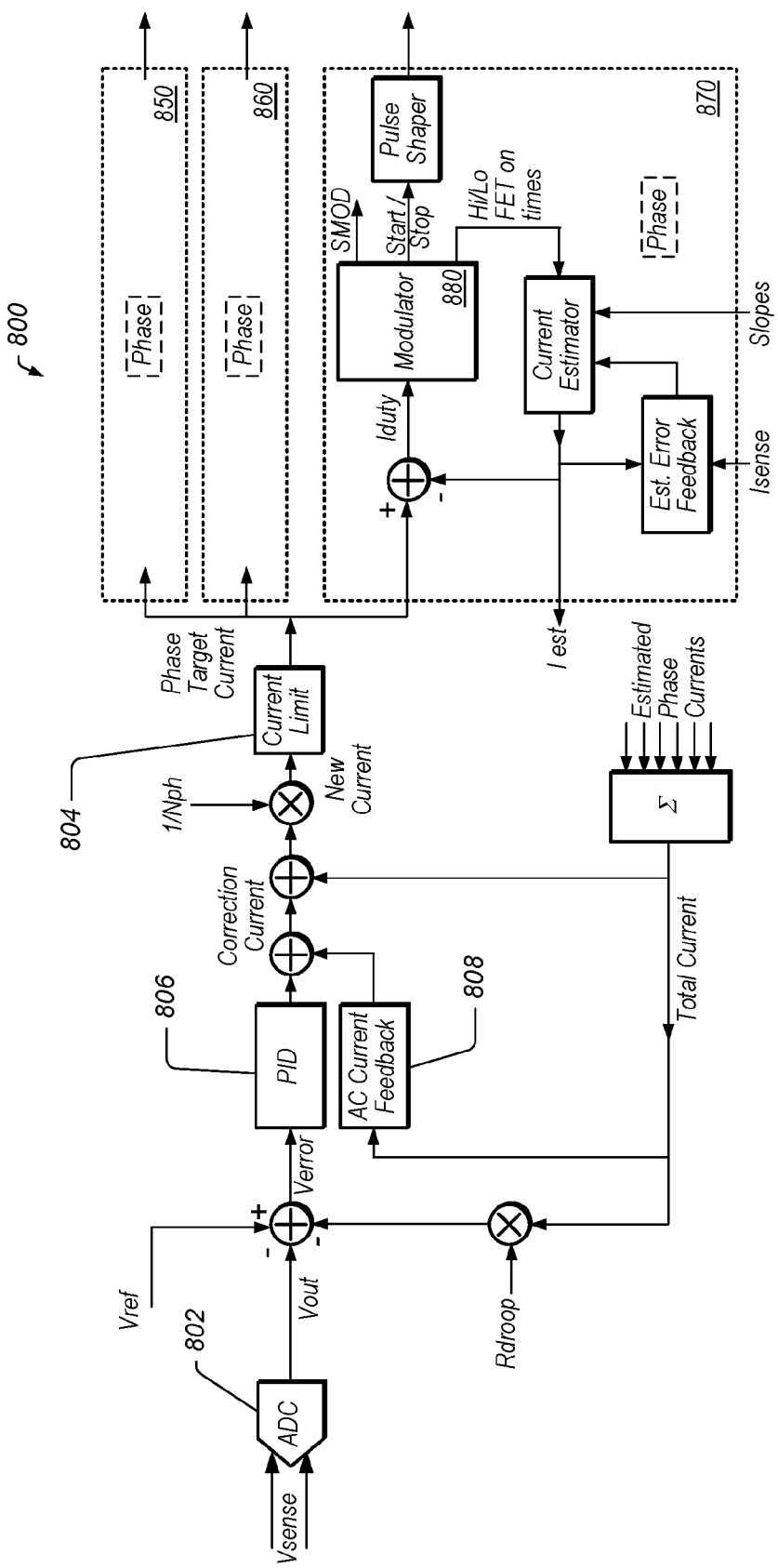
FIG. 8 shows the partial logic diagram of system components used in a synthetic digital droop implementation according to one embodiment.

Pursuant to the above, FIG. 8 shows the partial logic diagram of one embodiment of a synthetic digital droop implementation 800. The implementation shown in FIG. 8 operates with high accuracy current synthesis, which may be performed with a lower speed ADC 802 to correct steady state level. The synthetic digital droop system also features negative latency with respect to the current information in the loop, allowing for better loop stability, and further operates with low or no noise from the current sense path (the current sense ADC 802 may be significantly filtered). It should be noted that the aforementioned latency is negative because the synthesizer may be aware of the shape of the PWM waveform without incurring the latency or propagation delay of the PWM output through the driver circuitry which is typically tens of nanoseconds. That is, as shown in FIG. 8, droop may be implemented by synthesizing the current waveforms for each phase (850, 860, 870), and using those synthesized currents. Therefore, a basic loop architecture that already relies on a current synthesizer for modulation may be used, and if the synthesized current value is accurate enough to meet the droop requirements, not only does system 800 yield low latency with respect to digital droop, it may yield negative latency. In addition, it may feature desirable noise isolation for the current sense path, while using a high speed, high resolution full voltage range ADC 802.

It should be understood that droop is one form of current feedback in a regulation loop. Other forms of current feedback that may or may not affect the steady state value of the regulator output benefit similarly from the low-latency, low-noise and highly-accurate inductor current information supported by the various systems and methods of current synthesis described herein. One such current feedback mechanism is illustrated in FIG. 8 as "AC Current Feedback" 808. This feedback path supplements the derivative, "D", component from the PID compensator 806. Derivative compensation is particularly sensitive to latency and noise, both of which may be greatly improved with the use of a synthetized current.

"Current Limit" circuit component 804 implements inductor current limiting. By placing the current limiting function 804 in this location in the control loop, preventive current limiting may be performed. The "New Current" input to the current limiting block 804 is based on the synthesized current, which is an accurate representation of inductor current, and is further based on the correction current, which is representative of the change in current computed in the compensator 806 to correct any output error voltage, or Verror. In this configuration, the inductor current does not need to exceed a threshold to initiate current limiting because the PWM modulator 880 is prevented from receiving a command for a current above the desired limit. This also eliminates any override or bypassing of the PWM modulator 880 to effect current limiting. More conventional methods of current limiting result in reactive current limiting in which the inductor current has to surpass a limit and some measure for current limiting has to be employed which usually involves arresting the PWM modulator to stop the ramping of inductor current. The latencies of the detection and reaction typically require that the current limit be margined to accommodate the additional current ramping that occurs after the limit is exceeded. This margining reduces the effective operating range for a given set of component tolerances.

Figure 9:
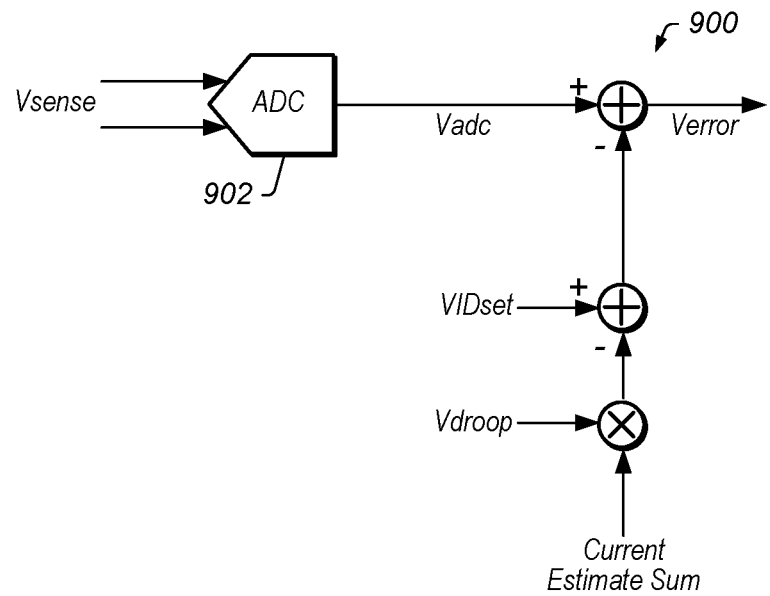
FIG. 9 shows on embodiment of the connectivity of an ADC in a synthetic digital droop implementation.

As mentioned above, a low latency/high resolution ADC may be used when implementing synthetic digital droop. FIG. 9 shows on embodiment 900 of the connectivity of such an ADC in an implementation such as the one shown in FIG. 8. By removing the reference DAC from the control/regulation loop, testing may be simplified. As shown in FIG. 9, the input may be a high resolution ADC 902 and may be tested as such. The latency associated with the DAC may be thereby eliminated, and absolute voltage limits for faults may be used. It also allows for a more linear response over wider range (not limited to an error ADC voltage range). Thus, from the perspective of the digital loop, the current synthesizer may feed directly into the voltage ADC output in order to change $V_{error}$ as fast as the digital calculations are performed. Without such implementation, the latency associated with adjusting (changing) an analog reference and digitizing the adjustment (change) may prevent the use of a synthesized digital droop. It should also be noted that low latency in droop further decreases the dynamic range requirements of the ADC 902.

Accurate Current Synthesis

As mentioned above, accurate current synthesis facilitates obtaining accurate droop. As also previously mentioned, in a switching power/voltage regulator PWM controller, current information (i.e., information about the inductor current) may be critical to response time and settling, among other things. Current synthesis enables the system to maintain stability with higher phase margin than without by reducing latency in the current loop. Various embodiments disclosed herein enable current synthesis aided by accurate, low-latency inductor-current measurement to support a variety of features in a switching regulator. These features include not only droop, but also voltage regulation, fault protection, telemetry, and in the case of multiphase regulators, current balance.

In various embodiments, a current synthesizer may be tuned for increasing accuracy (as accurate as measurement at low frequency and more accurate than measurement at high frequency), and lowering cost. The general shape of the current waveform may be modeled to embed non-idealities such that the synthesizer follows actual current through high speed ramps while using relatively low-bandwidth feedback for tuning. This may lower cost by decreasing the burden on the measurements required for tuning, and increases accuracy by virtue of an accurate model allowing tighter tracking than direct measurement can achieve, since no latency error is present in the synthesizer (zero latency is not possible with measurement). Knowledge of the shape of the current waveform may be leveraged to greatly under-sample the actual current with respect to the Nyquist criteria. In other words, knowledge of the shape of the current waveform may allow for sub-Nyquist-sampling of the current sense signal derived from the actual current. Of all non-idealities that may cause the synthesizer to deviate from actual inductor current, inductor-nonlinearity is probably the most significant. This is because as the inductor current increases, the rate of change in the current may change dramatically. In a typical scenario, the inductance may change by 10%-20% during the time period of a single PWM pulse. If the inductor is allowed to approach saturation, the change may be as much as 50%. Furthermore, priority-based adaptation of the synthesizer servo-to-measurement may be performed to ensure convergence by calculating offset, then down-slope, then up-slope, which lowers cost by decreasing the burden on the measurements required for tuning. In other words, under-sampling the actual current (waveform) may be used to obtain sampled values that are then used to calculate an offset with respect to the synthesized current waveform, which corrects the synthesized current waveform to track the actual current waveform. Furthermore, the sample time on the current waveform may be dithered with respect to the PWM output to avoid any synchronous interference corrupting the measurement, which lowers the risk of coupling noise into the current. Finally, the current sense input does not need to be buffered. The current may be sampled directly (e.g. from the pins) and the input current created from each sample may be cancelled by injecting an opposite charge on the subsequent sample, which lowers cost and power consumption of the current measurement path.

Tuning a Current Synthesizer for Increased Accuracy

Figure 10:
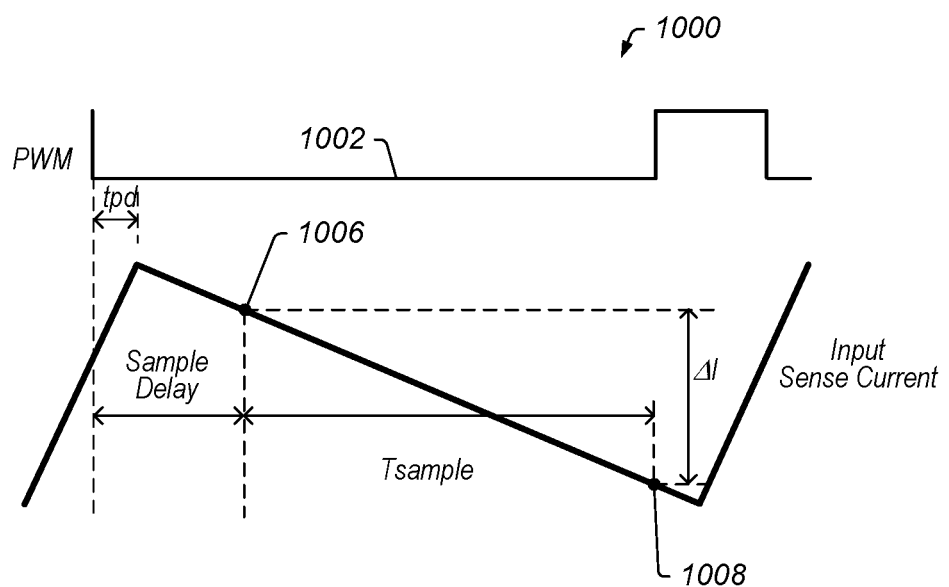
FIG. 10 shows a diagram illustrating the relationship between a PWM control signal and an inductor current generated responsive to the PWM control signal.

Since the PWM pulse widths may be directly controlled, the amount of current to be added or subtracted in the inductor may be known. The PWM outputs may control the current directly through the inductor(s), as exemplified by PWM control 134 in FIG. 1, for example. The relationship between the PWM signal and the inductor current is also illustrated in FIG. 10, showing the input sense current with respect to a PWM pulse. As seen in FIG. 10, sample points 1006 and 1008 represent the sample values obtained, with sample period Tsample separating sample points 1006 and 1008 in time. To put it another way, in a digital system PWM outputs may be known even before they leave the controller, and therefore even before the PWM outputs make it through the power stage, which allows for synthesized currents to be calculated before the actual current is generated. However, even though the basics of inductor currents are relatively simple, various sources of error may affect the accuracy of current synthesis. These sources include power stage delays, power stage artifacts (which may be present when turning on during large negative currents), inductor differences, inductor non-linearities, resistances (a function of temperature), and diode drops when the FETs (e.g. FETs 138 and 140 shown in FIG. 1) are both off. Nevertheless, the inductor current may be predicted, and accurate current synthesis may be improved by supplementing the calculations with actual current measurements to improve the accuracy of the current prediction. In this manner, the predicted current may be compared to the measured current to ascertain whether the former matches the latter.

Figure 11:
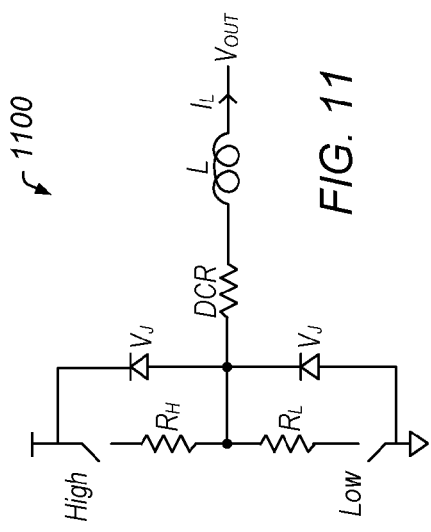
FIG. 11 shows one embodiment of a basic model for a current synthesizer, partially based on the output stage of a switching voltage regulator, according to one embodiment.
Figure 12:
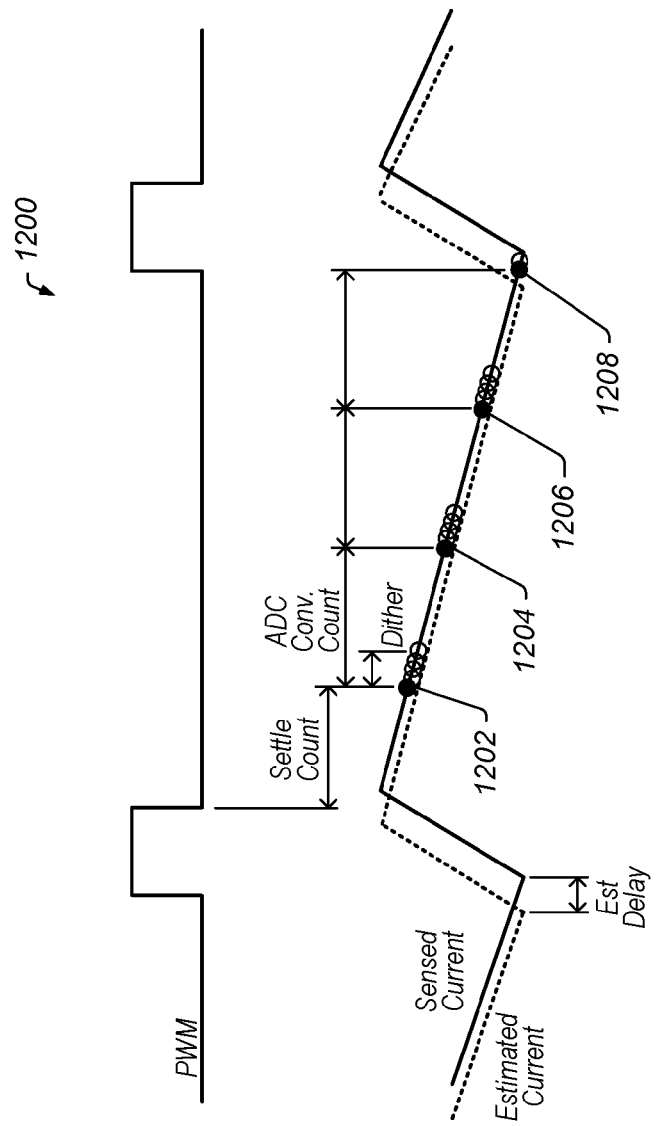
FIG. 12 shows a diagram of the estimated current and the sensed current with respect to a PWM control signal according to one embodiment.

A basic model for a current synthesizer is shown in FIG. 11, partially based on the output stage of the voltage regulator (i.e. FETs 138 and 140 in FIG. 1). The general shape of the current waveform may be modeled to embed non-idealities so that the synthesizer will follow actual current through high speed ramps while using relatively low-bandwidth feedback for tuning. The basic model within the current synthesizer shown in FIG. 11 includes a state representative of FET (On state/Off state), impedance corresponding to each FET ($R_H$ and R+), inductor (L), DCR (equivalent series resistance of the inductor), and diodes ($V_J$). For each state of the PWM waveform, the calculated change in current may be updated. In case one of the current slopes, e.g. the up-slope, is hard to measure, the other slope, e.g. the down-slope, or the slope where the signal is known to be good, may be measured, and the other slope may be calculated according to the measured slope. This process is illustrated in FIG. 12, which shows a diagram of the estimated current and the sensed current with respect to the PWM signal (pulses), with multiple sample points 1202-1208 indicated on the down-slope. It should be noted that the model shown in FIG. 11 is a linear model. Important factors taken into consideration when using the model shown in FIG. 11 include the component values, the inductance non-linearity, temperature dependence, FET drive timing errors, discontinuous (diode) conduction, DC accuracy (which may be corrected via measurement), and slope/inductor accuracy. Thus, as shown in FIG. 12, offset error is measured at each sample, while slope error is measured between samples. A sample-time dither may be added after the wait time for the first sample (i.e. subsequent to the settle count), following which coherent sampling may be performed for the slope. This process averages synchronous noise or interference and ensures high signal quality.

FIG. 13 shows a conceptual model 1300 of a lossy circuit (based on the model shown in FIG. 11), indicating various resistances that may be accounted for, including the on resistance of the low-side FET ($Ron_{EFF}$), the equivalent series resistance of the inductor (DCR), and any printed circuit board resistance ($R_{PCB}$) that may be present. In one set of embodiments, the implemented model may use a single lumped and programmable resistance (Rloss) as shown in model circuit 1302 in FIG. 13. Rloss is in this case representative of all "incidental" resistances accounted for in circuit 1302. In general, in order to reduce the complexity of the error sources, the error sources may be approximated and the correction loops may be relied upon to eliminate any residual errors. Hence the loss terms may be lumped together into a single term Rloss as seen in circuit model 1302, and the inductance non-linearity may be broken into eight non-linear steps, which may be very effective in an FPGA (field programmable gate array) emulation environment, for example. This is further illustrated in FIG. 14, which shows the conceptual inductance versus current curve in graph 1400, and the eight steps shown as programmable break-points scaling the inductance (L) in graph 1402. In effect, the current break-points (i.e. break-points representative of the current) are shifted to model the nonlinearity of the inductance. In the example shown, fractional powers of 2 are used to define a set of discrete inductance values: L*[(1); (1 1/256); (1 1/128); (1 1/64); (1 1/32); (1 1/16); (1 1/8); (1 1/4); (1 1/2)]. Such an implementation is amenable to a low-cost logic implementation. As seen in graph 1404, curve 1410 represents the actual inductor current, with curve 1412 representative of the modeled value(s). Because slope-changes due to non-linear inductance happen faster than may be accurately tracked, the non-linearity is modeled to obtain as accurate an approximation as possible, and the PI (Proportional Integral) control loops may be used to provide the correction for the inaccuracies that may be present in the approximation, as will be further discussed below.

Figure 15:
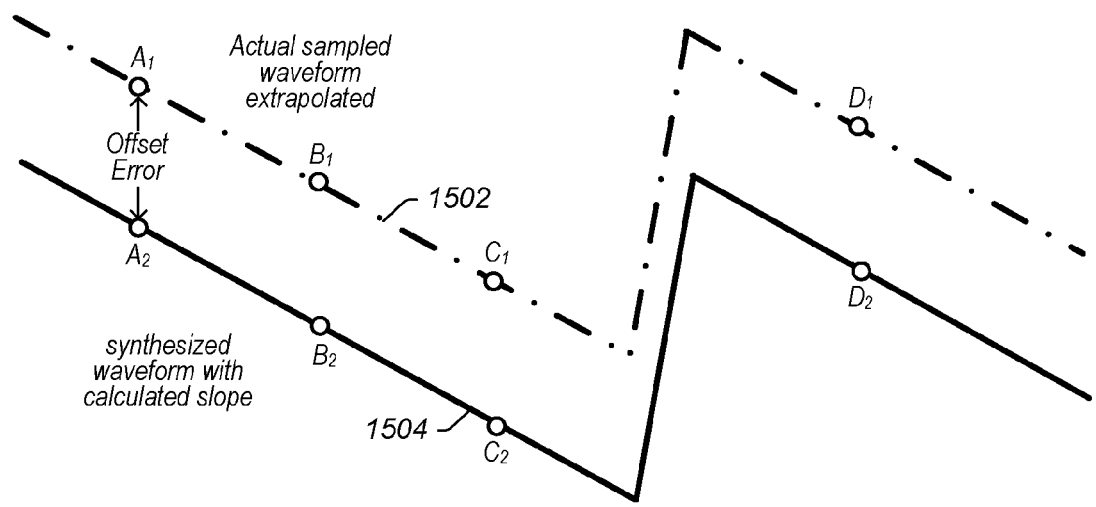
FIG. 15 shows current waveforms illustrative of both an actual sampled waveform and a synthesized approximation (prediction) waveform corresponding to the inductor current, according to one embodiment.

FIG. 15 shows current waveforms illustrative of both the actual sampled waveform 1502 and the synthesized approximation (prediction) waveform 1504 corresponding to the inductor current. Knowledge of the current waveform shape may be leveraged to greatly under-sample the actual current with respect to the Nyquist criteria. Furthermore, priority-based adaptation of the synthesizer servo-to-measurement may be performed to ensure convergence, first determining the offset, then the down-slope based on multiple data points, then the up-slope based on data points on two different down-slope portions.

As shown in FIG. 15, at various points in time there may be an error between the actual sampled values (from which the illustrated waveform is extrapolated) and the corresponding values of the synthesized current waveform. Respective value pairs for the actual current and synthesized current are indicated as ($A_1$, $A_2$), ($B_1$, $B_2$), ($C_1$, $C_2$) and ($D_1$, $D_2$), respectively. As also illustrated in FIG. 15, three points are measured on the downslope. In various embodiments, multiple points, e.g. two or more points may be consecutively (or successively) measured/sampled, representing sub-sampling, or sub-Nyquist sampling by virtue of the reduced number of sample points with respect to full measurements. The sampled points may be used to correct offset and slope errors of the synthesized current waveform with respect to the actual current waveform. More specifically, every point may be used to correct for an offset error, as illustrated with respect to points $A_1$ and $A_2$ in FIG. 15. This represents a quick correction and may be expressed as:

Offset Error=$A_1$-$A_2$,

Offset Error=$B_1$-$B_2$,

Offset Error=$C_1$-$C_2$, and

Offset Error=$D_1$-$D_2$.

Furthermore, two points on the same line, e.g. $A_1$, $A_2$ and $B_1$, $B_2$, and/or $B_1$, B2 and $C_1$, $C_2$ may be used for correcting the down-slope of the line, which represents a slower correction and may be expressed as:

Down-slope Error=($A_1$-$B_1$)-($A_2$-$B_2$), and

Down-slope Error=($B_1$-$C_1$)-($B_2$-$C_2$).

Finally, two points with an up-slope between them may be used to detect up-slope errors, or for correcting the up-slope of the line, which represents the slowest correction and may be expressed as:

Up-slope Error=($C_1$-$D_1$)-($C_2$-$D_2$).

Overall, offset detection/correction may be performed based on a corresponding pair of points respectively representative of an actual sampled value of the inductor current and a value of a synthesized (predicted/generated) current waveform corresponding to the inductor current at a same (designated) point in time. The offset correction may then be relied upon to correct a down-slope of the synthesized current, and the down-slope correction may then be relied upon to correct the up-slope of the synthesized current. It should be noted that while the points (and measurements) are shown to be made on the down-slope, alternative embodiments may make measurements on the up-slope if sloping of the current waveform allows for multiple timely measurements on the up-slope. While such embodiments are not shown herein, they are possible and are contemplated.

Figure 16:
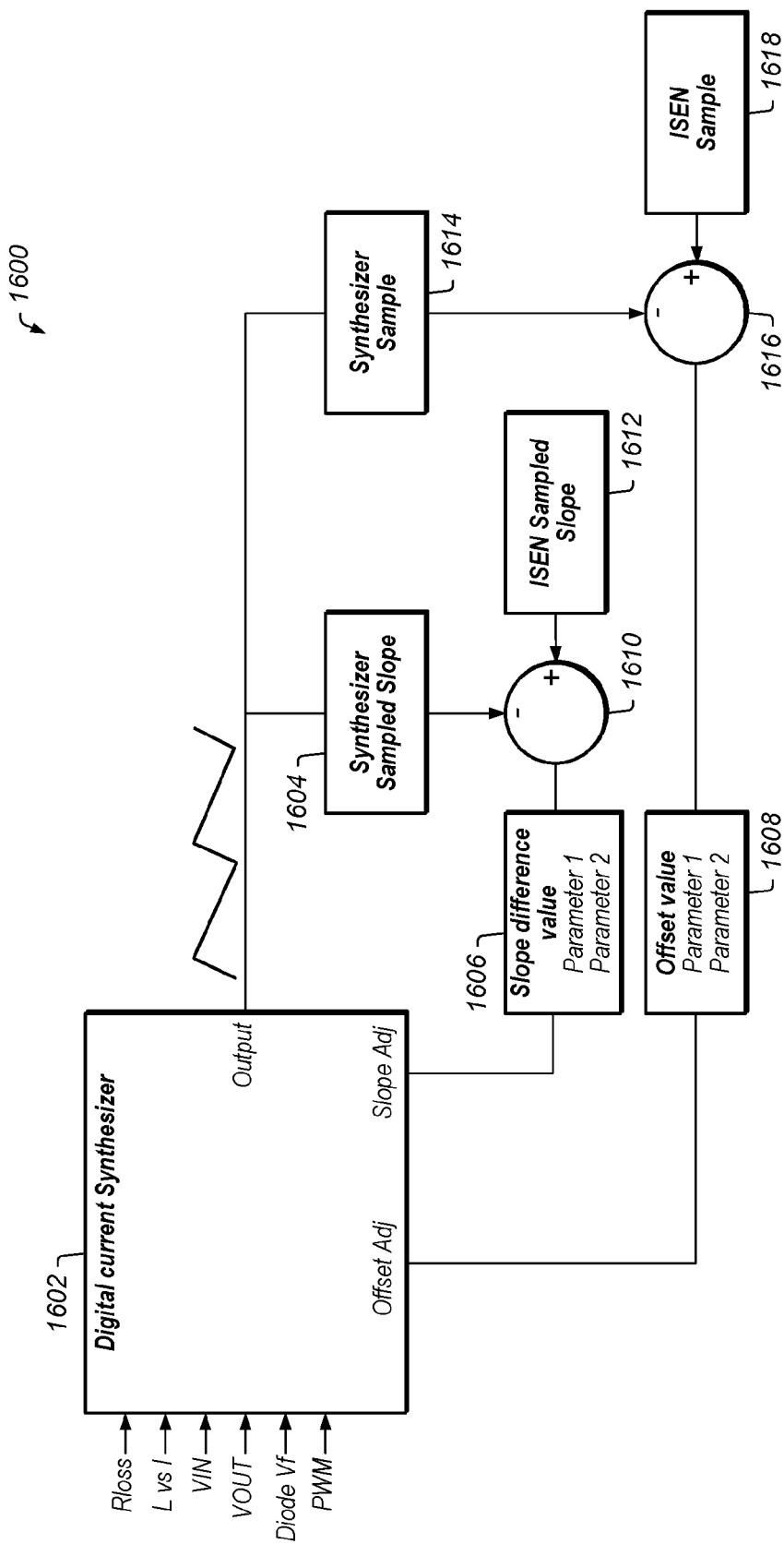
FIG. 16 shows one embodiment of a novel adjustable current synthesizer.

FIG. 16 shows one embodiment of a current synthesizer system/circuit 1600 which may be used to synthesize/predict current, which may be usable for more accurate control of the output voltage of a regulator, for example. System 1600 is capable of maintaining high accuracy in current synthesis. The offset and slope errors are controlled using standard PI loops, and corrections are applied via slope changes to keep waveforms monotonic, as non-monotonic steps may trigger instability of limit cycling in a feedback loop. In other words, in order to maintain high accuracy, standard control theory PI loops may be used to correct the offset and slope values within the system. As shown in FIG. 16, a digital current synthesizer 1602 may generate (or synthesize) a current waveform that is intended to be representative of the inductor current (in inductor 142 in FIG. 1, for example), and output this synthesized signal—representative of the inductor current—at its output. The difference between an actual current sensor sample, (that is, a sampled value of a current sense signal derived from the actual inductor current), provided at 1618, and the corresponding (in time) synthesizer sample provided at 1614, is obtained at node 1616, thereby producing an offset value provided to control node 1608. Similarly, the difference between a sampled slope value (which may be obtained from a pair of sample values) provided at 1612, and the corresponding (in time) synthesizer sampled slope value (which may be obtained from a pair of synthesizer sample values, or pair of generated values representative of the synthesized waveform) provided at 1604 is obtained at node 1610, thereby producing a slope correction value provided to control node 1606. The parameters (Parameter 1 and Parameter 2) at control node 1606 and control node 1608 represent the control parameters for the P (proportional) and I (integral) terms, respectively, for implementing a PI control loop for each the offset and slope correction. The inputs to the current synthesizer 1602 represent the pertinent values corresponding to the model illustrated in FIG. 11, FIG. 13 and FIG. 14. Digital current synthesizer 1602 then uses the offset adjustment and slope adjustment to adjust the output, i.e. the synthesized current waveform presented at the Output of digital current synthesizer 1602.

Figure 17:
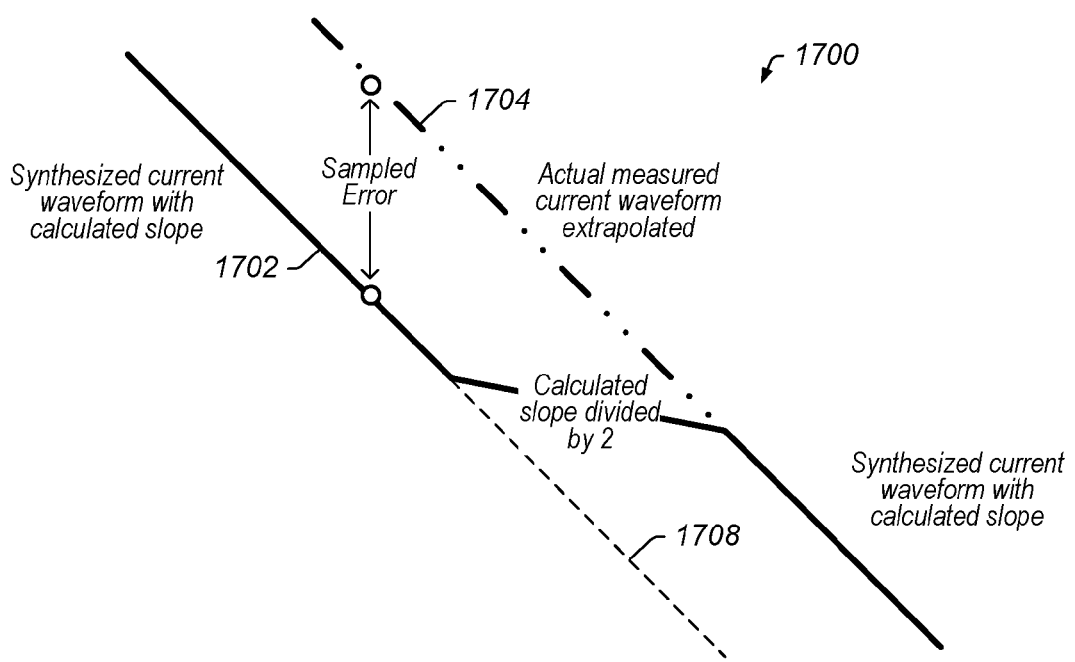
FIG. 17 shows a current diagram illustrating maximum positive offset correction of the synthesized current waveform, according to one embodiment.

FIG. 17 shows a current diagram 1700 illustrating positive error correction of the synthesized current waveform 1702 with respect to an extrapolated actual measured current 1704. The synthesizer output (e.g. output of synthesizer 1602) may be updated with slope adjustments in order to ensure monotonicity in the synthesizer results, and help stabilize the feedback loop(s). In other words, although offset values between the actual current (based on sample values of the actual current) and the synthesized current (based on samples of the synthesized current at the same points in time at which the actual current is sampled) may be obtained, adjustment based on the offset values may be made to the slope of the synthesized current as opposed to instantaneous values of the synthesized current, thereby ensuring monotonicity in the synthesized current results. A maximum single positive correction may be designated as a division of the calculated slope by a factor of two (2). Accordingly, if the offset error is greater than zero (0) then the calculated slope of the synthesized current waveform may be divided by 2 until lines 1702 and 1704 intersect. The dashed portion 1708 extending from waveform 1702 represents where synthesized current waveform 1702 would extend without correction. The positive error correction refers to the actual measured current value being greater than the corresponding presently synthesized current value. Referring again to FIG. 16, this would be applicable when the generated value provided at 1614 is lower than the sensed sampled value provided at 1618, and hence the output of 1616 is higher than zero.

Figure 18:
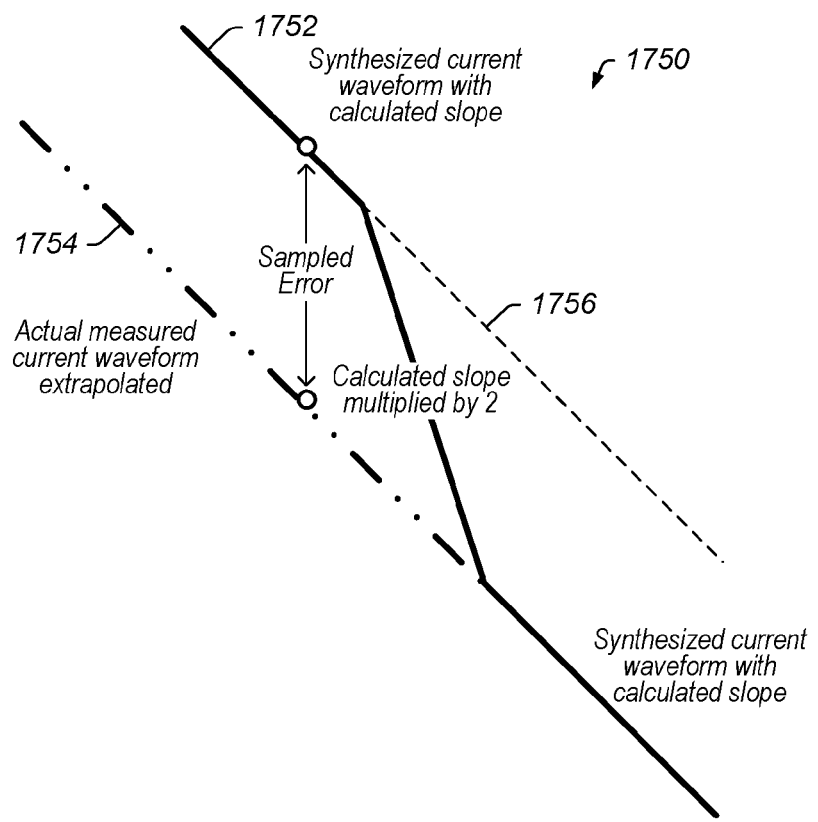
FIG. 18 shows a current diagram illustrating maximum negative offset correction of the synthesized current waveform, according to one embodiment.

FIG. 18 shows a current diagram 1750 illustrating negative error correction of the synthesized current waveform 1752 with respect to an extrapolated actual measured current 1754. The synthesizer output (e.g. output of synthesizer 1602) may again be updated with slope adjustments in order to ensure monotonicity in the synthesizer results, and help stabilize the feedback loop(s). A maximum single negative correction may be designated as a multiplication of the calculated slope by a factor of 2. Accordingly, if the error is less than zero then the calculated slope may be multiplied by 2 until lines 1752 and 1754 intersect. The dashed portion 1756 extending from waveform 1752 represents where synthesized current waveform 1752 would extend without correction. The negative error correction refers to the actual measured current value being lower than the corresponding presently synthesized current value. Referring again to FIG. 16, this would be applicable when the generated value provided at 1614 is higher than the sensed sampled value provided at 1618, and hence the output of 1616 is lower than zero.

It should be noted that the correction illustrated in FIG. 17 and FIG. 18 pertains to the offset correction, and the value of the slope of the synthesized current may be corrected in addition to this offset correction, with the correction of the value of the slope based on the difference between the respective slopes of the actual current and the synthesized current (as shown in FIG. 16, according to components 1612, 1604, 1610 and 1606). In other words, the offset correction may be implemented by performing a maximum correction of the slope of the synthesized current, responsive to the offset error between a sample value of the actual current and a corresponding sampled (generated) value of the synthesized current at the same point in time at which the sample of the actual current is obtained. One embodiment of the maximum correction may include dividing the present value of the slope of the synthesized current by a specified value responsive to the offset being greater than zero, and multiplying the present value of the slope of the synthesized current by a specified value responsive to the offset being lower than zero. This maximum correction may be performed each time an offset calculation or determination is made (i.e. for each pair of sampled actual current value and sampled generated/synthesized current value), until the offset value is zero (or is lower than a specified minimum value below which the offset value may be considered to be zero even if it is not exactly zero), which may be considered to indicate that the actual current waveform and the synthesized current waveform intersect/overlap to a required extent (as illustrated in FIG. 17 and FIG. 18), and no further offset correction may be required. As also previously noted, however, the slope of the synthesized current waveform may also require correction based on the slope of the synthesized current waveform differing from the slope of the actual current waveform, which is described above as the slope adjustment with respect to the system shown in FIG. 16. Furthermore, the down-slope and up-slope may each be corrected as previously described with respect to FIG. 15.

Figure 19:
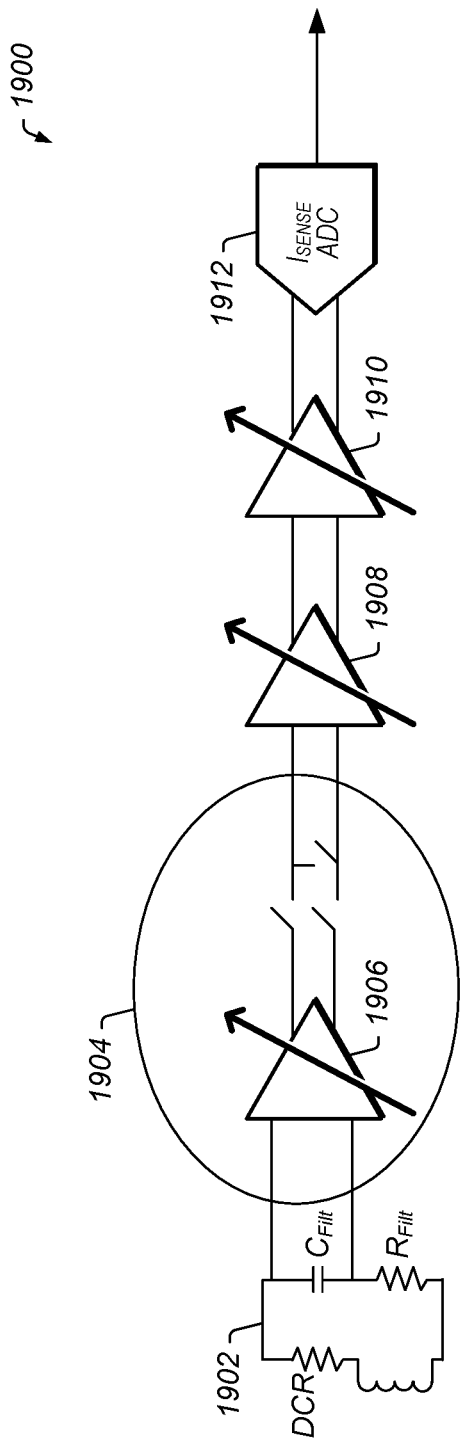
FIG. 19 shows one embodiment of a low offset, high gain current sense path that may be used to sample an actual current.

FIG. 19 shows one embodiment of a low offset, high gain current sense correction path 1900 that may be used to obtain the sample values of the actual current waveform. Circuit 1902 is representative of an inductor current sensing circuit in the output stage of a voltage regulator, for example, or more generally, representative of the actual current source of the current (waveform) on which measurements for obtaining the samples (e.g. 1618 and 1612) are performed. The current sense correction path includes three sampling stages 1906, 1908 and 1910, from which ADC 1912 may generate a corresponding digital value. In one set of embodiments, sampling stage 1906 may be part of a switched capacitor circuit 1904, which may be used to perform input current compensation in the first stage to allow for a high impedance sampled input. As previously mentioned, and as seen in FIG. 19, the sensed output is not buffered, but instead the current may be sampled directly (e.g. from the pins of the IC on which the regulator and/or regulator control circuitry is implemented), and the input current created from each sample is cancelled by injecting an opposite charge, that is, cancelling the charge, on the subsequent sample via switched capacitor circuit 1904. The input current compensation is discussed in further detail below in the section titled "Input Current Compensation during Current Measurement".

Figure 20:
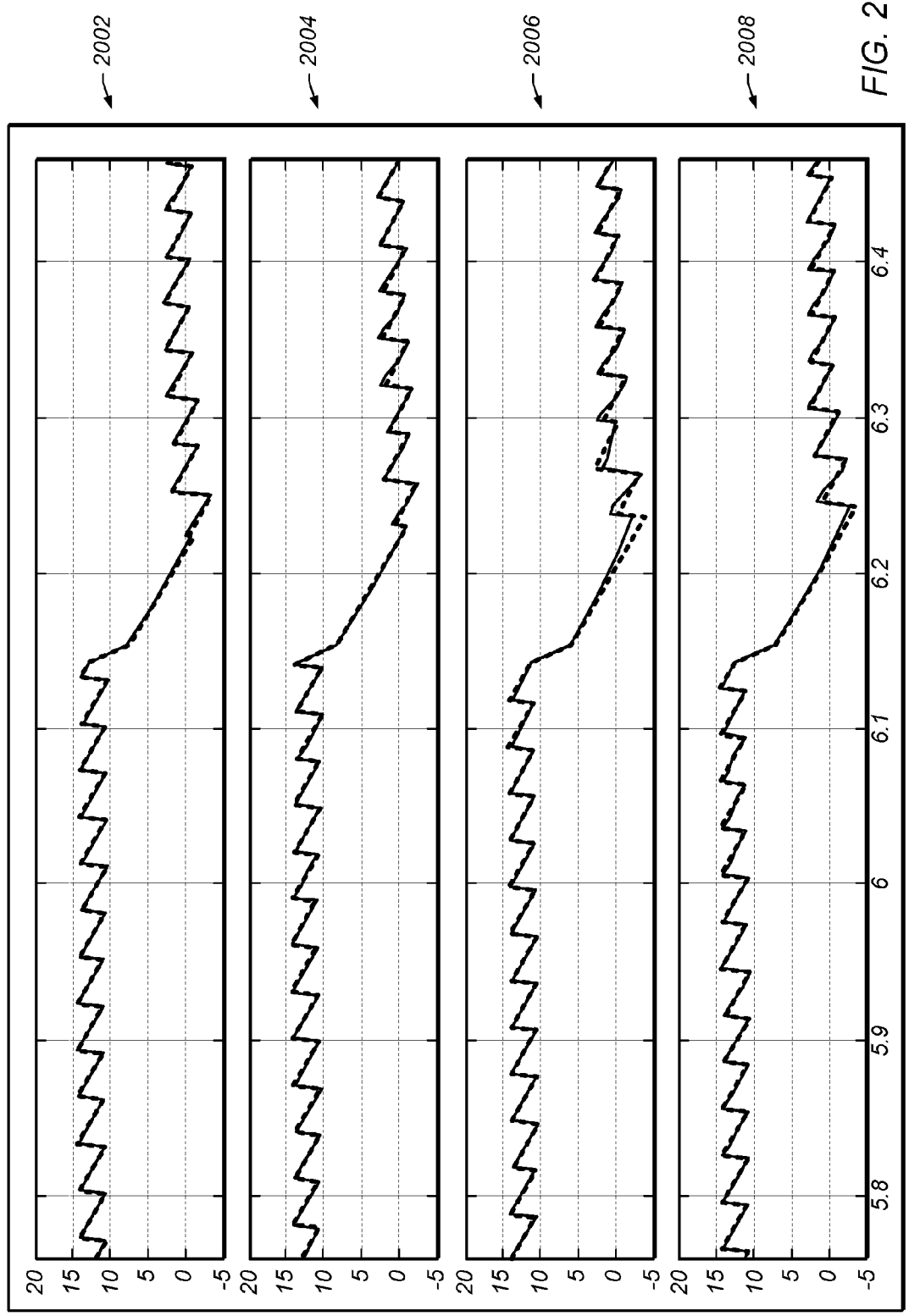
FIG. 20 shows current diagrams for a system response for four successive current sample phases, according to one embodiment.
Figure 21:
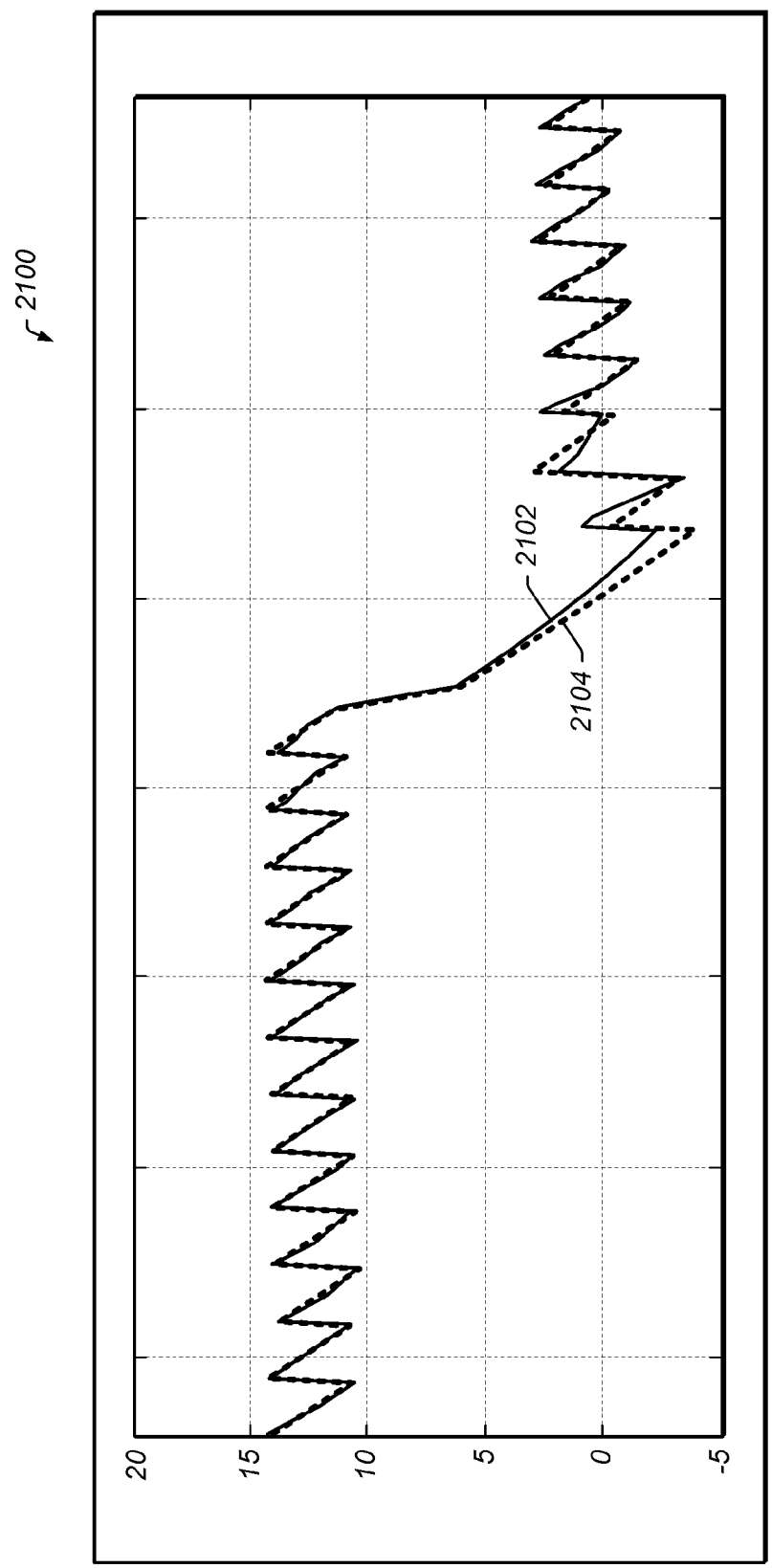
FIG. 21 shows zoomed-in representation of one of the current sample phases of FIG. 20.

FIG. 20 shows current diagrams for a system response for four successive current sample phases 2002, 2004, 2006 and 2008. The dashed line in the respective graph of each phase represents the actual current waveform while the solid line in the respective graph of each phase represents the synthesized current waveform. As seen in FIG. 20, the synthesized current waveform closely tracks the actual current waveform and helps loop stability with transients. FIG. 21 shows zoomed-in representation of phase 2006 from FIG. 20, curve 2104 representing the actual current waveform and curve 2102 representing the synthesized current waveform. Once the ADC corrections resume after the transient, the corrections are visible on the graph.

Figure 22:
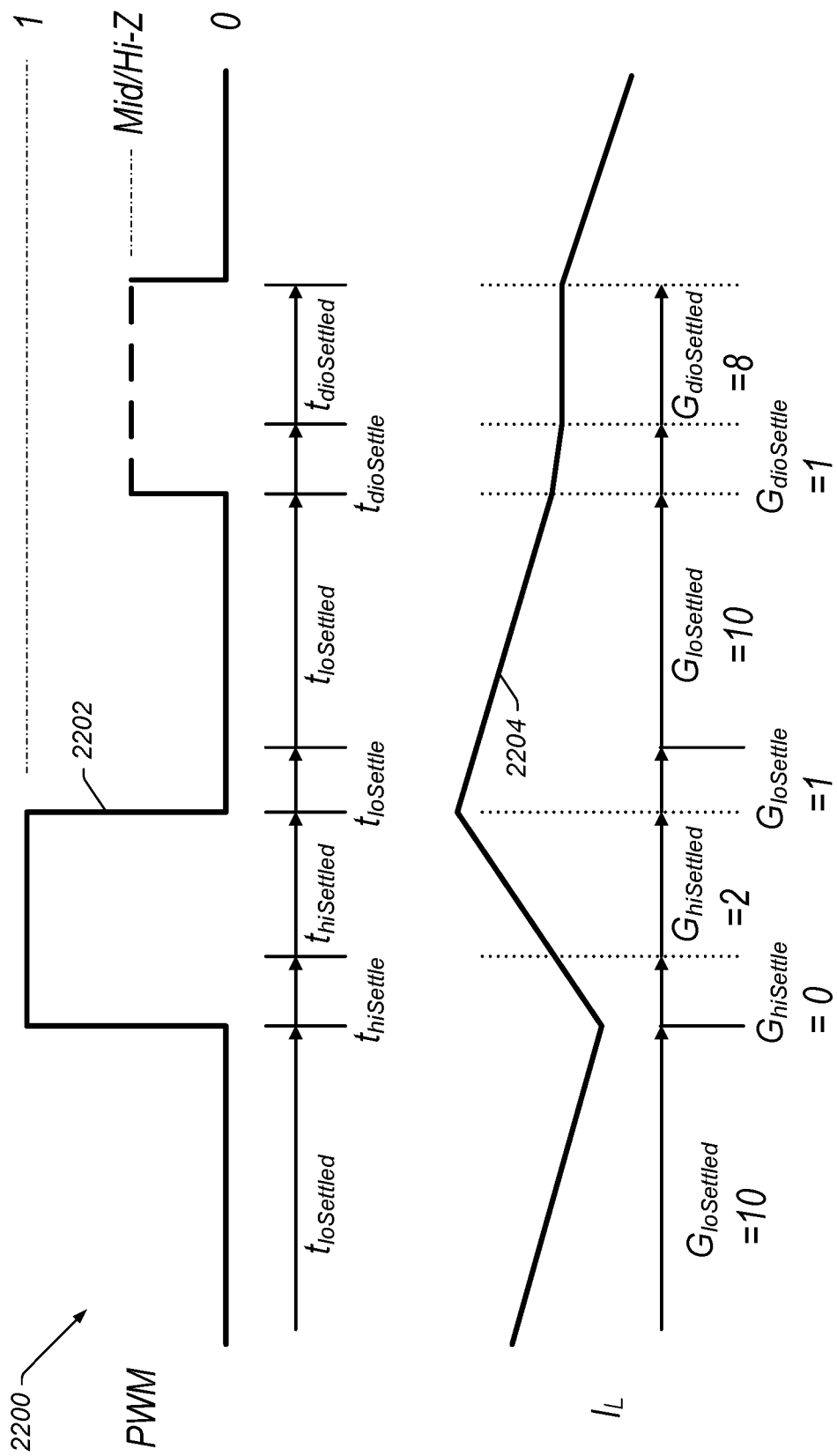
FIG. 22 shows a waveform diagram illustrating current sense waveform masking, according to one embodiment.

FIG. 22 shows a waveform diagram 2200 illustrating a concept referred to herein as "current sample masking". Masking refers to a process of selecting a weighting factor that affects how strongly each measurement of inductor current is considered in determining an error between measured current and synthesized current. The masking weight may therefore determine how fast the system reacts to correcting such an error. Masking allows the current tracking system to ignore or de-emphasize samples that may be of questionable value to the tracking system due to, for instance, a likelihood of interference in a particular measurement, or a measurement taking place a point in time when the state of the system is in question, or during a state of the system for which the synthesizer model is known to prefer low sample weighting. An example PWM (control) waveform 2202 may be a control waveform for a switching voltage regulator, with $I_L$ (inductor current) waveform 2204 representative of the inductor current generated responsive to at least the PWM waveform. PWM waveform 2202 illustrates three states: a low state in which the switched terminal of the inductor is actively pulled to a low voltage through a low-side switch or FET, a high state in which the switched terminal of the inductor is actively pulled to a high voltage through a high-side switch or FET, and a Mid/Hi-Z state in which both switches or FETs are in a non-conducting state. In the final state the inductor current will forward-bias the body diode of one of the two FET's, the FET in question determined/selected according to the polarity of the inductor current. FIG. 22 also depicts transitional states between each PWM state. These transitional states describe time segments for which the system is in a process of settling from an event and are assumed to not be well modeled in the synthesizer. For each PWM event (rising edge, falling edge, mid-Drive/ Hi-Z state) a period of time (or length of time) may be specified for each designated slot. The designated slots may be grouped into two major categories, namely a 'settle' slot, and a 'settled' slot. Therefore, as illustrated in FIG. 22, there may be a different "settle" and "settled" slot for each PWM event. A respective masking weight may be specified (defined) for each respective time slot, with the respective gain used with the measurement information taken during the respective time slot to update the corresponding current sense information.

The respective masking weight values may determine the extent to which the actual measurement is used to correct the synthesized current waveform. For example, there are four different values shown in FIG. 22, with 0 representing no impact/no correction/open loop, 1 representing very little impact/correction/slow correction, and 10 representing high masking weight/large impact/fast correction. Any values in between may represent an intermediate level of correction according to the numeric value. This facilitates the use of each section of the corresponding current sense waveform, while limiting or zeroing the masking weight in sections of the waveform where the actual current sense waveform may be either very noisy, or simply invalid. In other words, it provides a means of further controlling how the actual measurement value is used in correcting the synthesized current waveform. As can be observed in FIG. 22, and referring back to FIGS. 15, 17 and 18, this is one way of controlling where (on the current waveform) samples are actually obtained for use in correcting the synthesized current waveform. For example, while samples may be obtained on the up-slope in the $G_{hiSettled}$ time slot, the low masking weight value indicates that the correction based on that sampled value has very little impact. On the other hand, samples obtained on the down-slope in the $G_{loSettled}$ time slot have a large impact as indicated by the high masking weight value.

Benefits of Accurate Current Synthesis

Pursuant to the above, a current synthesizer may be used for low, even negative latency, and the current synthesizer may be corrected using only changes in slope in order to ensure monotonicity. Accordingly, as also previously mentioned, the current offset, the up-slope, and the down-slope may all be independently corrected. By sampling multiple points during the down-slope, or anywhere where two or more points may be sampled in a row (sampling may also be performed on the up-slope if it is sufficiently low noise), the current offset, down-slope and up-slope may be updated with respect to the synthesized current, and corrections may be made accordingly so that the current synthesizer matches and learns the system response, allowing the system to react before the events actually happen. The ability to obtain low-latency inductor current information is enhanced through the use of an inductor current synthesizer. To make the current synthesizer accurate, it may be desirable to track system parameters that affect inductor current flow. These include the inductance itself, input and output voltages, resistive losses and switch-on and switch-off times.

Input and output voltages may be measured directly without significant additional cost. Resistive loss is a weak parameter in determining current in any high-efficiency power converter, and may be estimated with a fixed value. Switch on-time and off-time are well known—dead time is also weak and can be estimated with a fixed value. The inductance has a relatively loose tolerance (+/−20%) and varies significantly with temperature and inductor current itself. This variation with current may be particularly problematic because, if this non-linearity is not well modeled, the synthesizer may under estimate actual current, which might lead to driving the inductor into saturation. However, tracking this non-linearity in real time through measurement would defeat the purpose of using a current synthesizer, which is to avoid having to make (perform) fast, accurate measurements. Therefore, the non-linearity is modeled, so that the inductance value changes with the current value that is being estimated. In addition, adding dither to the sample delay after the PWM edge ensures noise immunity to systematic noise with respect to the PWM edge relationship.

The sensitivity to noise may also be reduced by masking known high noise time spans of the current waveform (as most of the noise generators on the PCB may be controlled, from which the best time to sample may be accurately determined)

Novel features of the various embodiments of improved current synthesis disclosed herein include, inductor tracking, inductor non-linear modeling, non-linear model structure, smooth L updates, direct sampling of slope, sample delay variation for noise immunity, valid sample masking, tolerance of sparse non-periodic slope samples, independent offset, and up-slope and down-slope tracking. It should be noted that due to noise sensitivity, the offset PI loop generally uses a gain of up to ~1, whereas the down-slope PI loop uses a significantly lower gain of ~0.1, and the up-slope PI may be significantly lower than the down-slope (typically 0.025). Therefore, if the up-slope is sampled instead of the down-slope, the gains may be changed respectively.

By capturing more than one sample per current waveform segment, the offset and slope of the inductor current may be calculated, and therefore the correct slope and offset may be obtained in the synthesized waveform. Because the offset measurement subtracts out of the down-slope measurement, the offset correction is independent of the slope correction. Since a good down-slope correction and good offset correction are both available, the difference between points with an up-slope between them is relative to the up-slope error, and therefore the up-slope in the current synthesizer waveform may be corrected as well. Furthermore, when sampling the current, the sample time may be dithered to make it asynchronous with the PWM frequency, and any system level interference to the measurements may also get dithered. The synthesizer may be used to obtain accurate estimates of various component values such as inductor value, inductor loss, and switch loss. Using the difference in synthesizer and measured current may also be used as a circuit fault indicator, which is better than the use of an absolute current limit because it prevents the system from having to approach a danger point before detecting a fault.

The synthesizer estimated component values may further be used for accurate auto-compensation, and configurable masks may be added to the PWM waveform where current information is preferably not strobed/measured, that is, where the current is not to be strobed and/or measured. Accurate current synthesis may also enable digital droop without suffering the latency of an ADC in the current path, peak current limits without use of an analog comparator, and power estimation by adding up current flow in synthesizer while the PWM signals are high. It may also facilitate obtaining a programmable inductor model in order to achieve fast adaptation to possibly non-linear inductance changes with high frequency current load hits.

Therefore, as described herein, various embodiments of an improved current synthesizer and current synthesizer method may include modeling the inductor non-linearity, body diode, and resistive loss. The resistive loss modeling may include individual loss elements, lumped elements and using a fixed estimate for loss. The accurate modeling allows up-slope tracking, down-slope tracking and offset tracking. Various embodiments may feature priority-based adaptation whereby offset adjustment has priority over down-slope adjustment which has priority over up-slope adjustment. Sample times may be dithered, and servo-to-measurement methods may include updating the offset to correct for errors between synthesized values and measured values, and updating the slope to correct for errors between synthesized slope value and measured slope value. Slope error correction may be achieved with a fixed slope correction factor maintained until the error is zero, and also through the use of a dynamic slope correction factor whereby the slope correction is proportional to the error. Sample masking provides means for selecting sample points where the sensed signal exhibits desired quality. Consequently, new features of inductor telemetry, loss estimation, and circuit fault detection from excessive synthesized value vs. measurement error may be enabled, for example in PWM controllers.

Input Current Compensation During Current Measurement

One source of error in current measurement is the loss associated with non-zero source impedance from the current sensor interfaced to a non-infinite input impedance measurement circuit. In systems for which both of these impedances, or at least the ratio of these impedances, are known to sufficient accuracy, or in systems for which the source impedance is sufficiently low, the loss at the interface may not be of concern. However, in systems for which the sensor impedance is not well known or for which the sensor impedance is of a very low value, a very high input impedance measurement circuit may be needed to reduce the interface loss error to an acceptable level. Furthermore, in systems incorporating digital current measurement, sampling the signal from the sensor is an inherent part of the digitization process. Sampling circuits typically have moderate input impedance unless preceded by a high-impedance continuous-time buffer. Such buffers have to bear the full burden of accuracy of the current sensing system, and can therefore greatly increase the circuit area and power consumption of digital current measurement. A very high input impedance sampling circuit would be beneficial to such systems.

Figure 23:
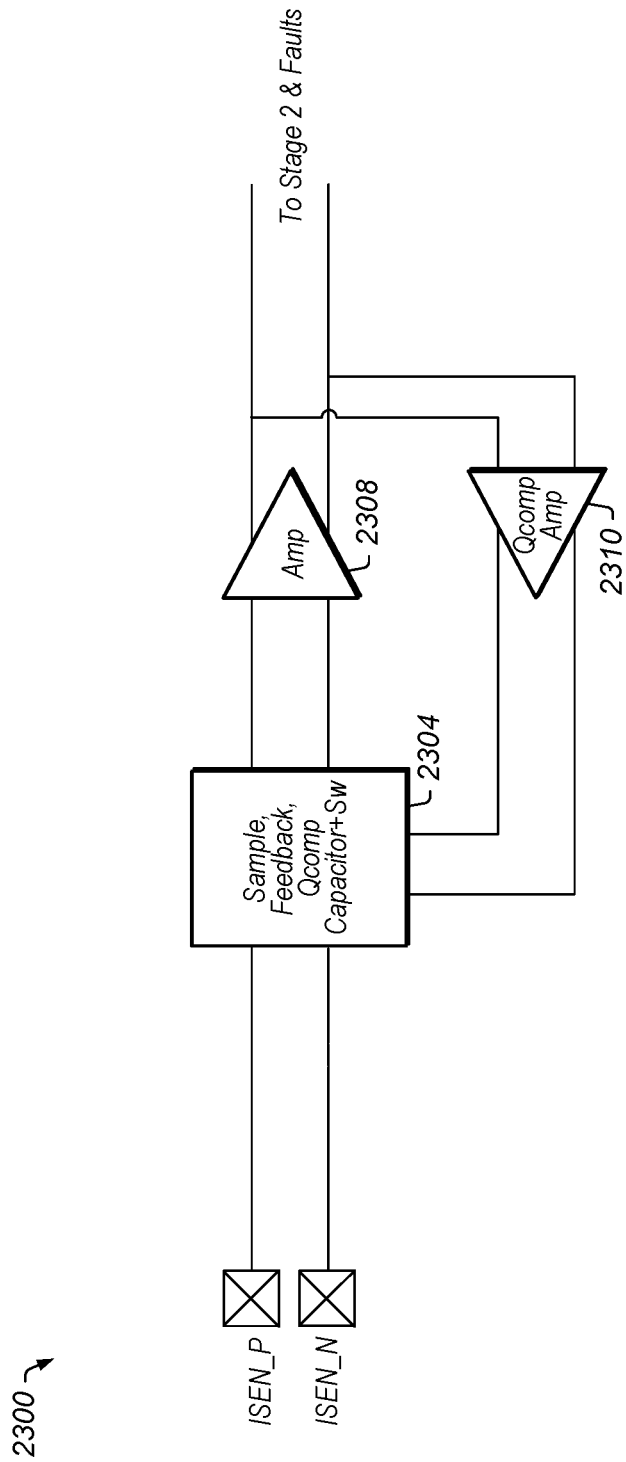
FIG. 23 shows a partial block diagram of one embodiment of the first stage of the current sense path of FIG. 19, including an input current compensation circuit.

As previously mentioned, during the current sensing (sampling) process, a multi-stage current sense path may be used. One such current sensing (sampling) path is exemplified in FIG. 19. FIG. 23 shows a partial block diagram of one embodiment of the first stage 1906 of the current sense path of FIG. 19, including an input current compensation circuit. As shown in FIG. 23, sense pins ISEN_N and ISEN_P receive the current sense signal from an inductor current sensing circuit utilizing an RC filter with inductor-matched time-constant, $\tau=L/DCR=R_{Filt} \cdot C_{Filt}$. This RC circuit defines the source impedance of the current sensor mentioned above. In addition to the time constant matching requirement, there are practical limits on component values, resulting in resistors typically in the range of several hundred Ohms ($\Omega$) to several kilo-Ohms (k$\Omega$). ISEN_N and ISEN_P feed into a circuit block 2304 that includes the sampling, feedback, charge compensation capacitors, and switching circuitry. Amplifiers 2308 and 2310 operate in a switched-capacitor configuration. The output from amplifier 2308 is provided to the next stage (stage 2). The compensation capacitors of circuit block 2304 and amplifier 2310 are together operated to dump equivalent charge back to ISEN_N and ISEN_P inputs every cycle, as will also be further detailed below.

Figure 24:
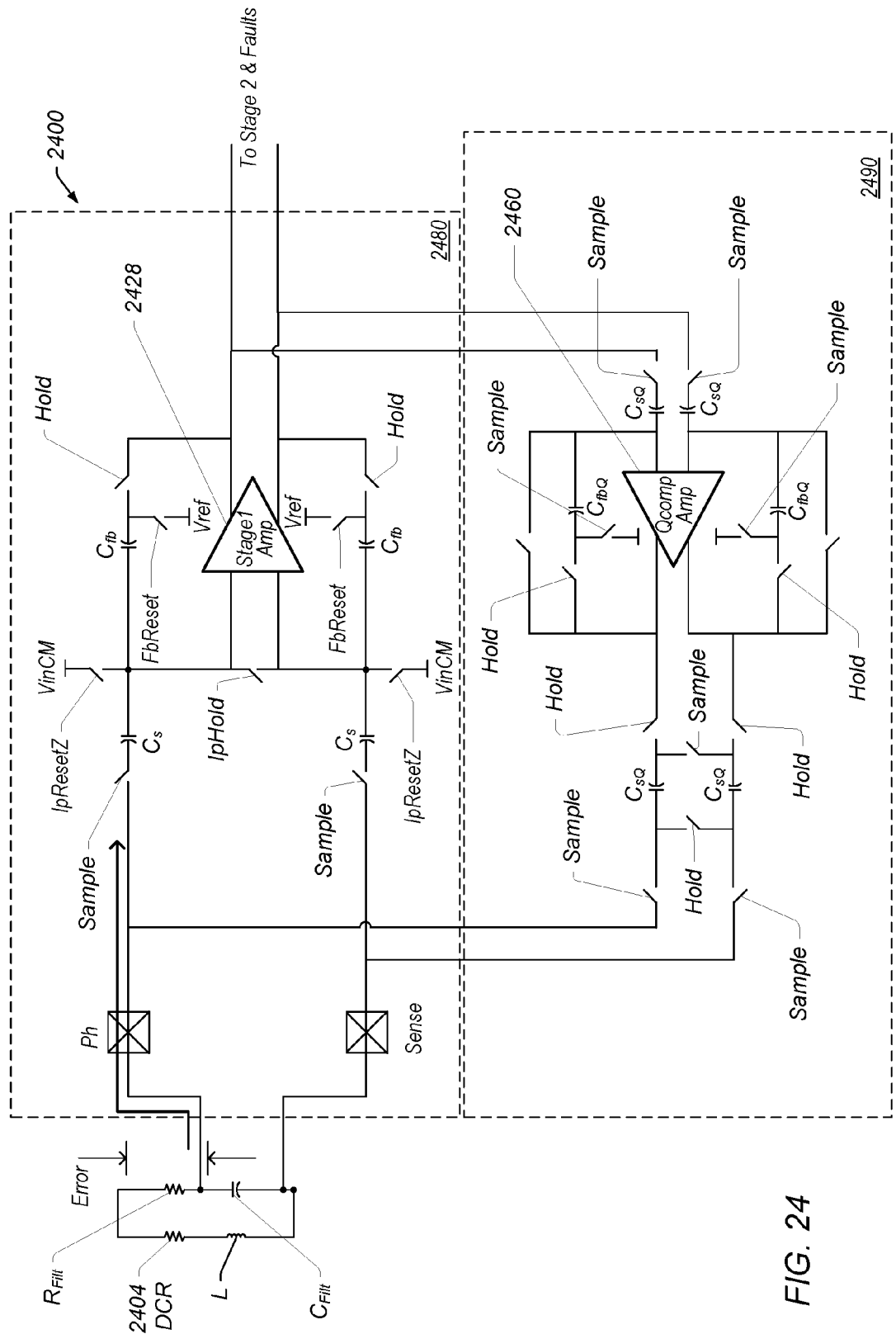
FIG. 24 shows in more detail portions of the partial block diagram shown in FIG. 23.

FIG. 24 shows in more detail portions of the partial block diagram shown in FIG. 23. In the embodiment shown in FIG. 24, the current sense input is unbuffered, and sampling is directly from the pins. The input current created from each sample may be cancelled by injecting opposite charge on a subsequent sample. More generally, the input current resulting from charging the sampling capacitors may be substantially reduced (below a level considered negligible or acceptable), or canceled by injecting a corresponding amount of charge at the sense inputs during a subsequent sampling period. Furthermore, the input current compensation allows for high impedance sampled input. As shown in FIG. 24, the sampling circuit 2480 of the stage 1 programmable gain amplifier (PGA) 2428 is a switched capacitor based circuit resulting in a signal level dependent input current. The drop across DCR filter resistor 2404 due to this current results in a gain error if left uncompensated. The compensator circuit 2490 operates to provide the equivalent charge back to the ISENSE inputs (Sense and Ph) every cycle to reduce below a specified level (or cancel) the input current required to charge the stage 1 PGA's sampling capacitors. As long as the time difference between the input charge being drawn by the sampling circuit 2480 and the compensating charge being delivered by the compensator circuit 2490 is less than the DCR filter time constant $R_{Filt} \cdot C_{Filt}$ by at least a specified amount, and the sampling capacitance in 2480 is much smaller than $C_{Filt}$, then the momentary charge error does not corrupt the measurement.

By way of example, referring to FIG. 24, assuming that the gain of Stage 1 PGA 2428 is 4, for a sampling capacitor ($C_s$) value of 200 fF, the sampling capacitance is 4*200 fF. Consequently, the charge drawn from input may be expressed as (4*200 fF)*(DCR*I), where I is the inductor current. The average current and drop across the filter resistor ($R_{Filt}$) 2402 at a sampling frequency Fs of 48 MHz (clkTs) results in an error current of 4*200 fF*DCR*I*Fs, with a gain error=(Error Current*$R_{Filt}$)/(I*DCR), and an error coefficient of 38 u*$R_{Filt}$. For a typical $R_{Filt}$ value of 5 K$\Omega$, the gain error=19.2% if uncorrected. Therefore, based on the above configuration, the compensation circuit 2490 with compensation amplifier 2460 may be operated to charge a 200 fF capacitor ($C_{sQ}$) with 5*200 fF*(DCR*I) charge, and connect it back to the inputs (Sense and Ph) to cancel the input charging current.

Generally, on each sample, the compensation circuit 2490 may be operated to provide to the sense input a specified multiple of the charge drawn from the input on the previous sample, that is, the charge drawn on the sample preceding the sample on which the compensation circuit 2490 provides (injects) the charge back to the sense inputs. For example, if on a first sample a specified amount of charge Q was draw on the inputs, on a second sample (following the first sample), the compensation circuit 2490 may inject a specified multiple of Q to the sense inputs. This effectively cancels the input charging current, providing a high input impedance of the current measurement path.

As seen in FIG. 24, in one embodiment the sampling circuit 2480 and compensation circuit 2490 are implemented with fully differential switched capacitor circuitry, featuring capacitive auto-zeroed offset. The amplifier (PGA) gains may be based on the gain setting of amplifier 2428. For example, the compensation (Qcomp) gain for amplifier 2460 may be set to 1.25 when the gain of amplifier 2428 is 4, and/or it may be set to 2 when the gain of amplifier 2428 is 1. The output common mode (CM) may be set by a switched capacitor CMFB circuit to 1.65V. In addition, 4-bit fine gain settings may be implemented to add flexibility for adjustments based on post layout/silicon verification, with a range of +/−8% of the Qcomp gain in 1.2% steps.

It should also be noted that in systems for which both the non-zero source impedance from the current sensor and the non-infinite input impedance of the measurement circuit are known, or at least the ratio of these impedances is known to sufficient accuracy, the current error due to the loss at the interface stemming from non-zero source impedance may be corrected by other means. For example, when the source impedance or the ratio of the source impedance and input impedance of the measurement circuit are known at a desired level of accuracy, the error may be corrected and/or canceled computationally. In such a case, it may not be necessary to inject the charge into the sense inputs (as previously described), and the error may be accounted for in later stages when generating the sample value corresponding to the measurement of the current sense signal.

Although the embodiments above have been described in considerable detail, numerous variations and modifications will become apparent to those skilled in the art once the above disclosure is fully appreciated. It is intended that the following claims be interpreted to embrace all such variations and modifications. As previously mentioned, the single cycle predictive control method disclosed herein may be applied equally to various systems in which a control mechanism is employed to regulate a desired state variable, such as output state variables or other regulated state variables in the manner described herein.

What is claimed is:

1. A method for adjusting a synthesized current representative of an actual current, the method comprising:
    generating a synthesized current representative of an actual current according to a model of an actual circuit, wherein the actual circuit produces the actual current;
    deriving a first offset value from the actual current at a first point in time; and
    adjusting the synthesized current according to the first offset value.

2. The method of claim 1, wherein deriving the first offset value at the first point in time comprises:
    obtaining a first sample value of the actual current, comprising sampling a current sense signal derived from the actual current at the first point in time; and
    obtaining the first offset value from the first sample value and a corresponding first generated value representative of a value of the synthesized current at the first point in time.

3. The method of claim 2, further comprising:
    obtaining a second sample value of the actual current, comprising sampling the current sense signal at a second point in time occurring subsequent to the first point in time;
    obtaining a second offset value from the second sample value and a corresponding second generated value representative of a value of the synthesized current at the second point in time; and
    adjusting the synthesized current according to the first offset value and the second offset value.

4. The method of claim 3, further comprising adjusting a slope of the synthesized current according to:
    (i) a difference between the first sample value and the second sample value; and (ii) a difference between the first generated value and the second generated value.

5. The method of claim 4, wherein adjusting the slope of the synthesized current comprises adjusting the slope of the synthesized current according to a slope offset obtained by subtracting (ii) from (i).

6. The method of claim 1, wherein adjusting the synthesized current according to the first offset value comprises:
    adjusting a slope of the synthesized current by a specified amount.

7. The method of claim 2, wherein adjusting the synthesized current according to the first offset value comprises adjusting a slope of the synthesized current by a specified amount, and wherein adjusting the slope of the synthesized current comprises:
    dividing the slope if the first offset value indicates that the first sample value is greater than the first generated value;
    multiplying the slope if the first offset value indicates that the first sample value is lower than the first generated value; and
    keeping the slope unchanged if the first offset value is less than a specified minimum value.

8. The method of claim 2, further comprising:
    obtaining one or more additional sample values of the actual current, comprising sampling the current sense signal at subsequent respective additional points in time; and
    obtaining one or more additional offset values from the one or more additional sample values and corresponding one or more respective generated values representative of corresponding respective values of the synthesized current at the subsequent respective additional points in time;
    wherein adjusting the synthesized current comprises adjusting a slope of the synthesized current according to the first offset value and the one or more additional offset values.

9. The method of claim 8, wherein obtaining the first sample value and the one or more additional sample values comprises under-sampling the actual current.

10. The method of claim 8, wherein adjusting the synthesized current comprises adjusting the slope of the synthesized current until one of the first offset value and the additional one or more offset values is less than a specified minimum value.

11. The method of claim 2, wherein sampling the actual current is performed on a first down-slope segment of the actual current.

12. The method of claim 11, further comprising:
    obtaining a second sample value of the actual current, comprising sampling the current sense signal on a second down-slope segment of the actual current at a second point in time occurring subsequent to the first point in time, wherein the actual current includes an up-slope segment between the first down-slope segment of the actual current and the second down-slope segment of the actual current;
    obtaining a second generated value representative of a value of the synthesized current at the second point in time; and
    adjusting an up-slope error of the synthesized current according to the first sample value, the second sample value, the first generated value, and the second generated value.

13. The method of claim 12, wherein adjusting the up-slope error of the synthesized current comprises:
    obtaining a first difference value representative of a difference between the first sample value and the second sample value;
    obtaining a second difference value representative of a difference between the first generated value and the second generated value; and
    adjusting a slope of the synthesized current according to a difference between the first difference value and the second difference value.

14. A current synthesizer comprising:
    first circuitry configured to generate a synthesized current representative of an actual current according to a model of an actual circuit, wherein the actual circuit produces the actual current; and
    a correction circuit configured to:
    derive a first offset value from the actual current at a first point in time; and
    adjust the synthesized current according to the first offset value.

15. The current synthesizer of claim 14, further comprising:

a sampling circuit configured to obtain a first sample value of the actual current by sampling a current sense signal derived from the actual current at the first point in time, wherein, to derive the first offset value, the correction circuit is configured to:

obtain a first offset value from the first sample value and a corresponding first generated value representative of a value of the synthesized current at the first point in time.

16. The current synthesizer of claim 15, wherein to adjust the synthesized current, the correction circuit is configured to adjust a slope of the synthesized current by a specified amount, responsive to the first offset value.

17. The current synthesizer of claim 15, wherein the sampling circuit is further configured to obtain a second sample value of the actual current by sampling the current sense signal at a second point in time occurring subsequent to the first point in time; and wherein the correction circuit is further configured to adjust a slope of the synthesized current according to a slope offset value determined based on:

a difference between the first sample value and the second sample value; and a difference between the first generated value and a second generated value representative of a value of the synthesized current at the second point in time.

* * * * *